United States Patent
Nagaune

(10) Patent No.: US 9,502,329 B2
(45) Date of Patent: Nov. 22, 2016

(54) SEMICONDUCTOR MODULE COOLER

(75) Inventor: Fumio Nagaune, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 349 days.

(21) Appl. No.: 14/110,931

(22) PCT Filed: May 14, 2012

(86) PCT No.: PCT/JP2012/003141
§ 371 (c)(1),
(2), (4) Date: Oct. 24, 2013

(87) PCT Pub. No.: WO2012/157247
PCT Pub. Date: Nov. 22, 2012

(65) Prior Publication Data
US 2014/0054762 A1   Feb. 27, 2014

(30) Foreign Application Priority Data

May 16, 2011  (JP) ................................ 2011-109215
Nov. 8, 2011  (JP) ................................ 2011-244350

(51) Int. Cl.
*H01L 23/473*  (2006.01)
*H01L 23/00*   (2006.01)
*H01L 25/07*   (2006.01)

(52) U.S. Cl.
CPC ............. *H01L 23/473* (2013.01); *H01L 24/32* (2013.01); *H01L 25/072* (2013.01);
(Continued)

(58) Field of Classification Search
CPC . H01L 23/473; H01L 23/46; H01L 23/4735; H01L 24/32; H01L 2224/32225; H01L 25/072; H01L 2924/1203; H01L 2924/1305; H01L 2924/13055; H01L 2924/00
USPC ..................... 165/80.1, 80.3, 80.4; 361/699
See application file for complete search history.

(56) References Cited

U.S. PATENT DOCUMENTS 4,909,315 A * 3/1990 Nelson ............... H01L 23/4336
                                                    165/185
5,239,443 A * 8/1993 Fahey ................ H01L 23/4735
                                                    165/80.4
(Continued)

FOREIGN PATENT DOCUMENTS

JP  2001-024126 A  1/2001
JP  2001-308246 A  11/2001
(Continued)

OTHER PUBLICATIONS

China Patent Office, Office Action for CN 201280018786.9, Aug. 7, 2015.
(Continued)

*Primary Examiner* — Tho V Duong
*Assistant Examiner* — Raheena Rehman
(74) *Attorney, Agent, or Firm* — Manabu Kanesaka

(57) ABSTRACT

A semiconductor module cooler supplies a cooling medium to a cooling medium jacket from outside to cool a plurality of semiconductor elements thermally connected to the cooling medium jacket through a heat sink. The cooling medium jacket has a cooling fin cooling room including an opening for inserting cooling fins, and cooling the cooling fins; a cooling medium introduction port to introduce the cooling medium; a cooling medium diffusion room to diffuse and supply the cooling medium to the cooling fin cooling room; a cooling medium diffusion wall provided in the cooling medium diffusion room in which the cooling medium diffused by the cooling medium diffusion room flows over to be introduced to the cooling fin cooling room side; a cooling medium discharge port discharging the cooling medium to the outside; and a cooling medium convergence room provided between the cooling fin cooling room and the cooling medium discharge port.

10 Claims, 22 Drawing Sheets

(52) U.S. Cl.
CPC .............. *H01L 2224/32225* (2013.01); *H01L 2924/1203* (2013.01); *H01L 2924/1305* (2013.01); *H01L 2924/13055* (2013.01)

(56) References Cited

U.S. PATENT DOCUMENTS

| | | | | |
|---|---|---|---|---|
| 7,188,662 | B2* | 3/2007 | Brewer | H01L 23/473 165/80.4 |
| 7,277,284 | B2* | 10/2007 | Lee | H01L 23/3677 165/80.2 |
| 7,940,527 | B2* | 5/2011 | Krause | H01L 23/473 165/147 |
| 8,081,465 | B2* | 12/2011 | Nishiura | H01L 23/3735 165/147 |
| 2006/0219387 | A1 | 10/2006 | Atarashi et al. | |
| 2007/0045801 | A1* | 3/2007 | Sugiyama | H05K 1/0271 257/684 |
| 2007/0256810 | A1* | 11/2007 | Di Stefano | H01L 23/473 165/46 |
| 2008/0230208 | A1* | 9/2008 | Rasmussen | F28F 3/12 165/80.4 |
| 2008/0236793 | A1* | 10/2008 | Ma | F04B 43/04 165/80.4 |
| 2009/0095450 | A1* | 4/2009 | Asakura | H01L 23/473 165/104.33 |
| 2009/0250195 | A1* | 10/2009 | Yoshida | F28F 3/02 165/80.3 |
| 2009/0314467 | A1* | 12/2009 | Campbell | H01L 23/4735 165/80.4 |
| 2010/0090336 | A1 | 4/2010 | Yoshida et al. | |
| 2010/0172091 | A1* | 7/2010 | Nishiura | H01L 23/3735 361/689 |
| 2011/0308059 | A1* | 12/2011 | Seo | B23K 20/1265 29/428 |
| 2012/0181679 | A1* | 7/2012 | Kadoguchi | H01L 23/3142 257/676 |

FOREIGN PATENT DOCUMENTS

| | | |
|---|---|---|
| JP | 2004-080856 A | 3/2004 |
| JP | 2005-019905 | 1/2005 |
| JP | 2005-136278 | 5/2005 |
| JP | 2008-236137 A | 10/2008 |
| JP | 2008-263137 A | 10/2008 |
| JP | 2009-277768 A | 11/2009 |
| WO | 2009/153735 A1 | 12/2009 |

OTHER PUBLICATIONS

Europe Patent Office, Search Report for EP 12785260.6, Jun. 25, 2015.

Japan Patent Office, Office Action for Japanese Patent Application No. 2015-172590, Jul. 28, 2016.

* cited by examiner

SEMICONDUCTOR MODULE COOLER

RELATED APPLICATIONS

The present application is National Phase of International Application No. PCT/JP2012/003141 filed May 14, 2012, and claims priority from Japanese Applications No. 2011-109215 filed May 16, 2011 and No. 2011-244350 filed Nov. 8, 2011.

TECHNICAL FIELD

The present invention relates to a semiconductor module cooler, and more particularly, to a semiconductor module cooler in which heat dissipation fins are integrally formed on a rear surface of a heat sink to which an insulating substrate having a plurality of semiconductor elements arranged thereon is bonded and a cooling medium flows between the heat dissipation fins to dissipate heat generated from the semiconductor elements.

BACKGROUND ART

Semiconductor modules are widely used in power conversion devices which are generally used in, for example, hybrid vehicles or electric vehicles. A semiconductor module forming a control device for saving energy includes a power semiconductor element for controlling a large current.

The amount of heat generated from the power semiconductor element tends to increase when a large current is controlled. In particular, with a reduction in the size of the power semiconductor element or an increase in the output from the power semiconductor element, a very large amount of heat is generated from the power semiconductor element. It is very important to cool the semiconductor module including a plurality of power semiconductor elements.

In general, a liquid cooler (hereinafter, also referred to as a "cooler") has been used in the semiconductor module in order to improve the cooling efficiency of the semiconductor module. In the liquid cooler which circulates a cooling medium, in order to improve cooling efficiency, various methods, such as a method of increasing the flow rate of the cooling medium, a method of forming the heat dissipation fins (cooling bodies) such that a heat transfer coefficient increases, or a method of increasing the thermal conductivity of a material forming the fins, have been conceived.

The cooler is formed integrally with a metal base such that the heat dissipation fins having a thin plate shape are arranged in the flow path of the cooling medium at uniform density, and an insulating substrate on which a semiconductor chip generating heat is provided is bonded to the metal base. Pressure is applied to the flow path to make the cooling medium flow. Then, the exothermic energy of the semiconductor chip is effectively dissipated through the heat dissipation fins with a large surface area by the cooling medium. The cooling medium which is heated by the heat dissipated from the semiconductor chip is cooled by an external heat exchanger, and the cooled cooling medium is compressed by a pump and returns to the flow path in which the heat dissipation fins are arranged.

JP 2001-308246 A discloses a device as the cooler. The structure of the device according to the related art is illustrated in FIGS. 24, 25, and 26.

In the related art, a cooling passage 1002 which is surrounded by a wide cooling passage side wall 1004 is formed in a heat sink 1001. A cooling water inlet 1003a and a cooling water outlet 1003b are formed at the leading end and the rear end of the cooling passage 1002. In addition, openings 1005 are formed in the cooling passage 1002 at positions facing heat dissipation substrates 1104 of two semiconductor modules arranged on the heat sink 1001. A plurality of heat dissipation fins 1105 arranged in parallel on the heat dissipation substrates 1104 is inserted into the openings 1005 and the heat dissipation fins 1105 are immersed in the cooling passage 1002.

A plurality of insulating substrates 1103 is arranged on the heat dissipation substrates 1104 and semiconductor elements 1102 or circuit components are mounted on the insulating substrates 1103. The plurality of insulating substrates 1103 is covered with an upper cover 1101. In addition, a sealing portion 1109 is provided between the heat sink 1001 and the heat dissipation substrate 1104 so as to surround the opening 1005.

CITATION LIST

Patent Document

Patent Document 1: JP 2001-308246 A

DISCLOSURE OF THE INVENTION

Problem to be Solved by the Invention

In the above-mentioned cooler, the flow rate of the cooling medium flowing through the cooler is high at the center of the flow path in the width direction and is low in the periphery of the flow path. In the cooler, the degree of cooling of the semiconductor element 1102, which is arranged in the periphery of the flow path, is less than the degree of cooling of the semiconductor element 1102 which is arranged in the vicinity of the center of the flow path in the width direction.

When there is a temperature difference between the semiconductor elements, the output current from each semiconductor element is limited by the output current from the semiconductor element with the highest temperature. Therefore, the output current from the other semiconductor elements is limited by the output current from the semiconductor element with the maximum temperature and it is difficult to ensure a sufficient output from the other semiconductor elements even though a large amount of output current flows through the semiconductor elements in terms of the temperature.

The invention has been made in view of the above-mentioned problems and an object of the invention is to provide a semiconductor module cooler capable of reducing a temperature difference between semiconductor elements which are arranged in a direction intersecting the flow direction of a cooling medium with a simple structure.

Means for Solving Problem

In order to achieve the object, according to a first aspect of the invention, there is provided a semiconductor module cooler supplying a cooling medium to a cooling medium jacket from outside and cooling one or a plurality of semiconductor elements provided on an outer surface of the semiconductor module cooler and thermally connected to the cooling medium jacket through a heat sink. The cooling medium jacket includes: a cooling fin cooling room including an opening for inserting cooling fins formed on a surface of the heat sink opposite to a surface connected to the semiconductor elements, and cooling the cooling fins; a cooling medium introduction port to introduce the cooling medium; a cooling medium diffusion room to diffuse the cooling medium introduced from the cooling medium introduction port and supplying the cooling medium to the cooling fin cooling room; a cooling medium diffusion wall provided in a cooling fin cooling room side of the cooling medium diffusion room in which the cooling medium diffused by the cooling medium diffusion room flows over to be introduced to the cooling fin cooling room side; a cooling medium discharge port discharging the cooling medium to the outside; and a cooling medium convergence room provided between the cooling fin cooling room and the cooling medium discharge port.

According to a second aspect of the invention, a position of an upper end of the cooling medium diffusion wall may be equal to or greater than that of a position of an upper end of the cooling medium introduction port.

According to a third aspect of the invention, a surface of the cooling medium diffusion wall facing the cooling medium introduction port may be an inclined plane which is inclined forward from a lower part to an upper part thereof.

According to a fourth aspect of the invention, a position of an upper end of the cooling medium diffusion wall may be equal to or more than that of a position of an upper end of the cooling medium introduction port, and a surface of the cooling medium diffusion wall facing the cooling medium introduction port is an inclined plane which is inclined forward from a lower part to an upper part thereof.

According to a fifth aspect of the invention, the cooling medium diffusion room has a shape widening from the cooling medium introduction port toward the cooling medium diffusion wall.

According to a sixth aspect of the invention, the cooling medium diffusion room has a shape widening from the cooling medium introduction port to the cooling medium diffusion wall, and the cooling medium convergence room has a shape widening from the cooling medium discharge port to the cooling fin cooling room.

According to a seventh aspect of the invention, the plurality of semiconductor elements is arranged on the heat sink in a direction intersecting a flowing direction of the cooling medium from the cooling medium introduction port to the cooling medium discharge port.

According to an eighth aspect of the invention, the cooling fins are any one of the blade fins formed of a plurality of flat plates, a plurality of circular pins having a circular shape in a cross-sectional view, and a plurality of angular pins having a polygonal shape in a cross-sectional view.

According to a ninth aspect of the invention, when the cooling fins are formed of the plurality of circular pins or the plurality of angular pins, a pin array may be arranged in a zigzag array.

According to a tenth aspect of the invention, a sealing member is provided between the heat sink and the cooling medium jacket and surrounding at least the opening.

Effect of the Invention

According an aspect of the invention, a cooling medium can flow uniformly in the width direction of a cooling fin cooling room of a cooling medium jacket into which cooling fins formed on a rear surface of a heat sink having semiconductor elements arranged thereon are inserted. When one or a plurality of semiconductor elements is arranged on the heat sink in a direction intersecting the flow direction of the cooling medium, each semiconductor element is uniformly cooled. As a result, the temperature difference between the semiconductor elements generating heat is reduced and it is possible to ensure a sufficient output current from any semiconductor chip.

BEST MODE(S) FOR CARRYING OUT THE INVENTION

Figure 1A:
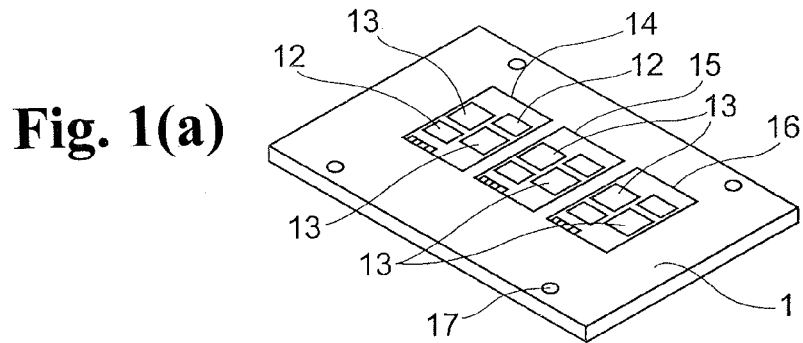
FIGS. 1(a)-1(d) are diagrams illustrating a cooler according to the invention.
Figure 1B:
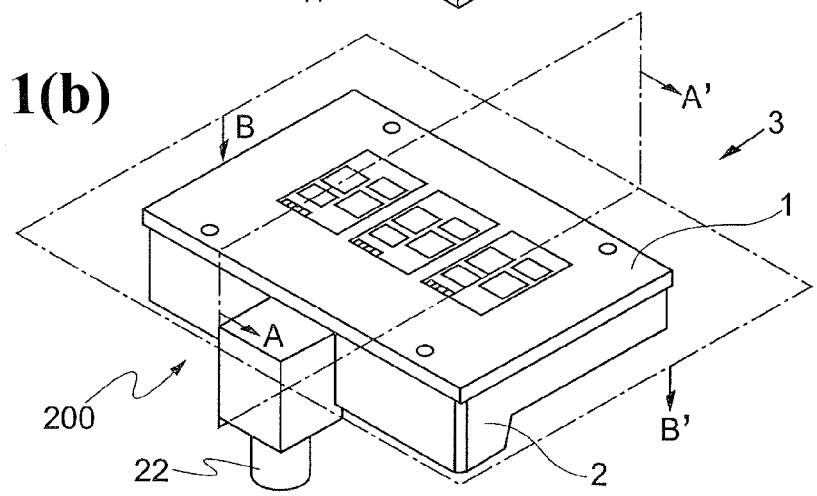
Figure 1C:
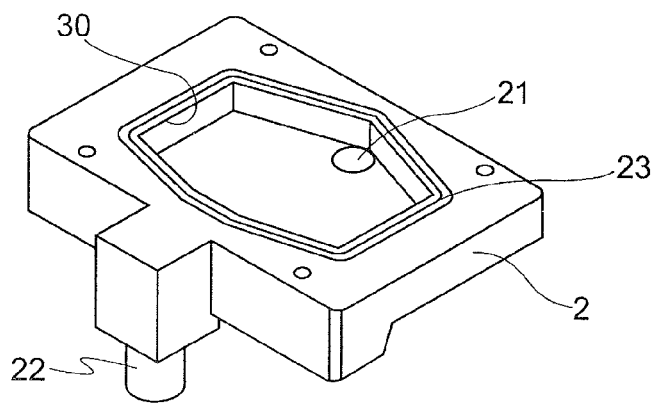
Figure 1D:
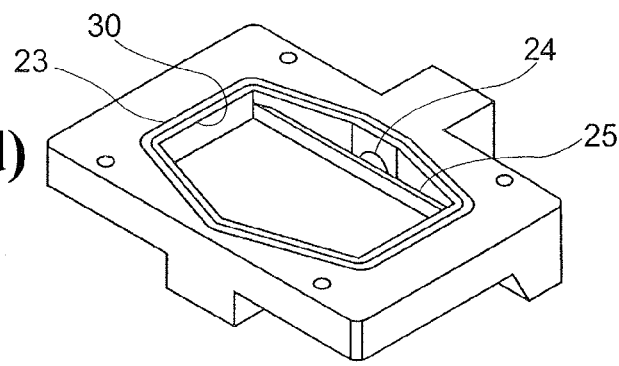

FIGS. 1(a)-1(d) are diagrams illustrating the outward appearance and internal structure of a semiconductor module cooler according to the invention. FIG. 1(b) illustrates the outward appearance of a semiconductor module cooler 3. FIG. 1(a) illustrates a heat sink 1 according to the invention and semiconductor circuits (14, 15, and 16) attached to the heat sink 1. Here, an example of the semiconductor circuit is an IGBT (Insulated Gate Bipolar Transistor) module. FIG. 1(c) illustrates a cooling medium jacket (water jacket) 2 according to the invention. FIG. 1(d) is a diagram illustrating a cooling medium introduction port of the cooling medium jacket (water jacket) 2 according to the invention.

Here, the semiconductor circuits 14, 15, and 16 are a circuit for a W phase, a circuit for a V phase, and a circuit for a U phase forming a three-phase inverter. As illustrated in FIG. 1(a), in the semiconductor circuit 14 serving as the circuit for a W phase, an IGBT element 13 serving as a semiconductor element and a free-wheel diode 12 connected in inverse-parallel to the IGBT element 13 which form an upper arm, and an IGBT element 13 and a free-wheel diode 12 connected in inverse-parallel to the IGBT element 13 which form a lower arm are mounted on an insulating substrate which is attached to the heat sink 1. The semiconductor circuit 15 serving as the circuit for a V phase and the semiconductor circuit 16 serving as the circuit for a U phase have the same structure as the semiconductor circuit 14 serving as the circuit for a W phase.

The cooling medium jacket (water jacket) 2 has a flat rectangular parallelepiped shape.

Figure 2:
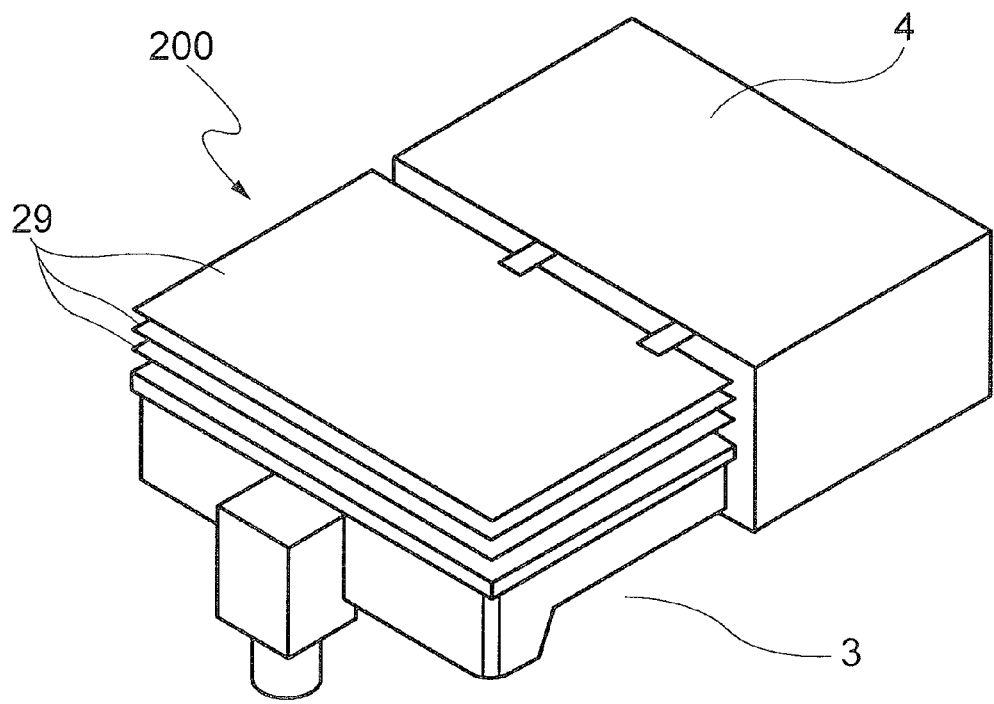
FIG. 2 is a diagram illustrating a semiconductor module according to the invention.

FIG. 2 is a diagram illustrating an example in which the semiconductor module cooler 3 according to the invention is used to form a semiconductor module 200. An example of the semiconductor module 200 is an IGBT module. A smoothing condenser 4 is provided on the side of the IGBT module to which an electronic circuit board 29 is attached.

Figure 3:
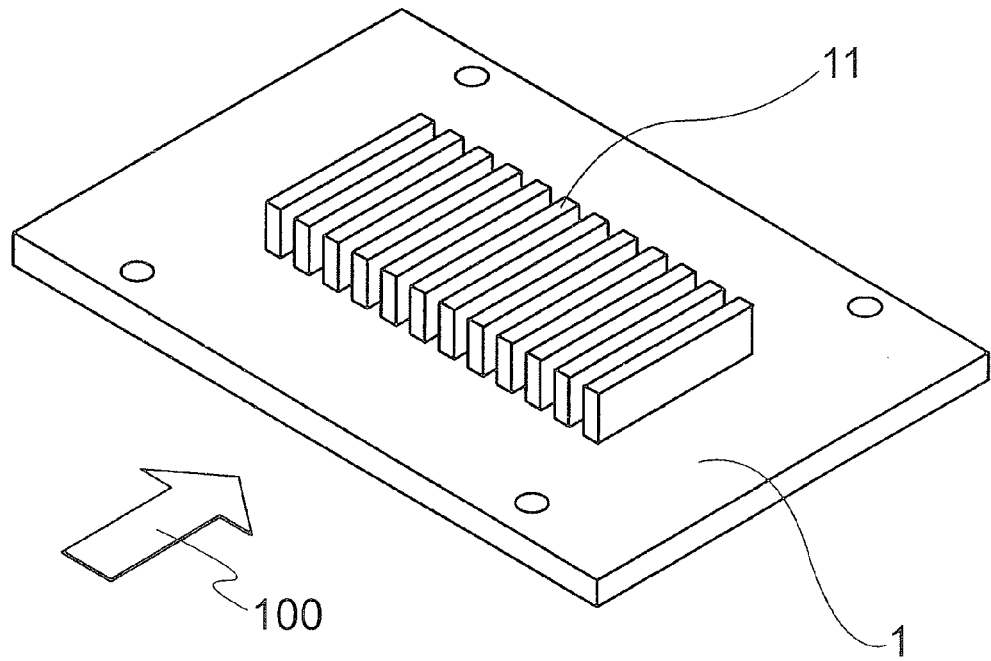
FIG. 3 is a diagram illustrating an example of fins according to the invention.

FIG. 3 is a diagram illustrating an example of blade fins according to the invention. FIG. 3 is a diagram viewed from the rear surface of the heat sink 1 in FIG. 1(a). In FIG. 3, blade fins 11 are arranged on the rear surface of the heat sink 1 in parallel in a direction perpendicular to a direction 100 in which a cooling medium flows.

Figure 4:
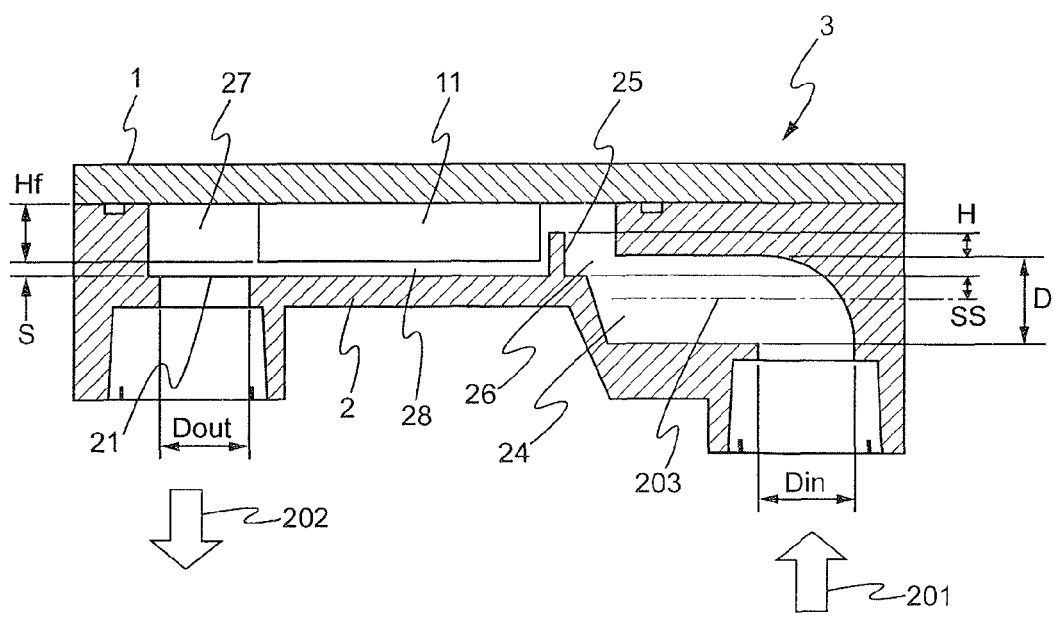
FIG. 4 is a cross-sectional view illustrating a first example of a cooling medium jacket according to the invention taken along the line A-A'.
Figure 5:
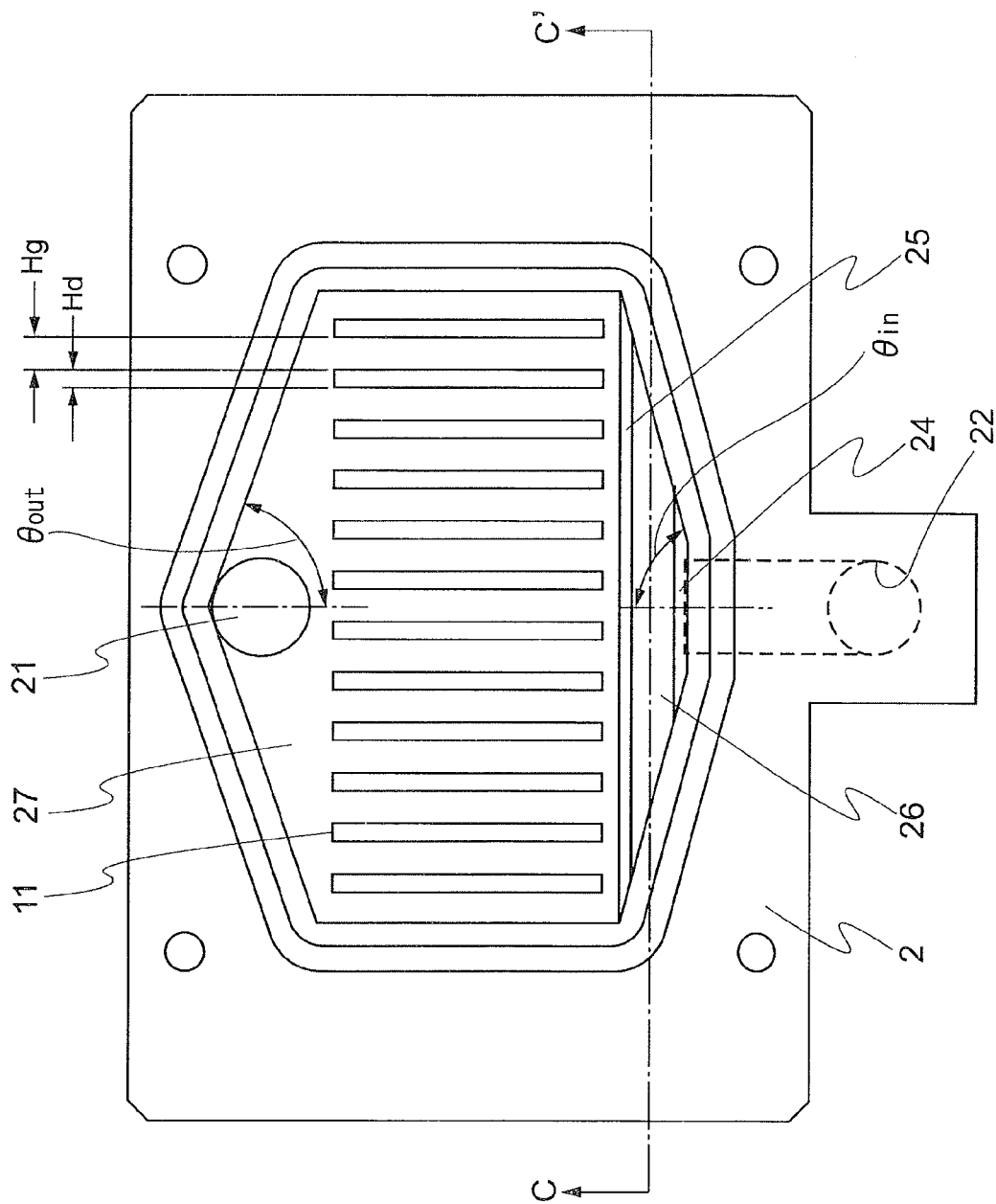
FIG. 5 is a cross-sectional view illustrating the first example of the cooling medium jacket according to the invention taken along the line B-B'.

FIG. 4 is a cross-sectional view taken along the line A-A' of FIG. 1(b). FIG. 5 is a cross-sectional view taken along the line B-B' of FIG. 1(b). The semiconductor module cooler 3 according to the invention will be described with reference to FIGS. 4 and 5. In the cooling medium jacket 2, a cooling medium inlet 22 is formed in the bottom of a central portion of one long side. A cooling medium, such as cooling water which is introduced from the cooling medium inlet 22 and is represented by an arrow 201, is discharged from a cooling medium discharge port 21 which is formed in the bottom of a central portion of the other long side of the cooling medium jacket 2, as represented by an arrow 202.

A space is formed between a cooling medium introduction port 24 and the cooling medium inflow end of a rectangular-parallelepiped-shaped cooling fin cooling room 28 in which the blade fins 11 are arranged. This space is referred to as a cooling medium diffusion room 26. A cooling medium diffusion wall 25, which is a bank, is provided in the cooling medium diffusion room 26 so as to lean to the cooling fin cooling room 28. A space is formed between the cooling medium outflow end of the cooling fin cooling room 28 and the cooling medium discharge port 21. This space is referred to as a cooling medium convergence room 27.

The cooling medium introduced from the cooling medium inlet 22 flows from the cooling medium introduction port 24 to the cooling medium diffusion room 26, passes through the blade fins 11 arranged in the cooling fin cooling room 28, reaches the cooling medium convergence room 27, and is discharged from a cooling medium outlet through the cooling medium discharge port 21. In this process, the blade fins 11 are cooled by the cooling medium and the semiconductor circuits 14 to 16 attached to the heat sink 1 are cooled. Here, the upper surfaces of the cooling medium diffusion room 26, the cooling medium convergence room 27, and the cooling fin cooling room 28 which face the heat sink 1 form an opening 30. The opening 30 is blocked by the heat sink 1, with the blade fins 11 inserted into the cooling fin cooling room 28. Fixing screws are inserted into attachment holes 17 provided in the heat sink 1, are engaged with female screws formed in the cooling medium jacket 2, and are tightened to fix the heat sink 1 to the cooling medium jacket 2.

Figure 6:
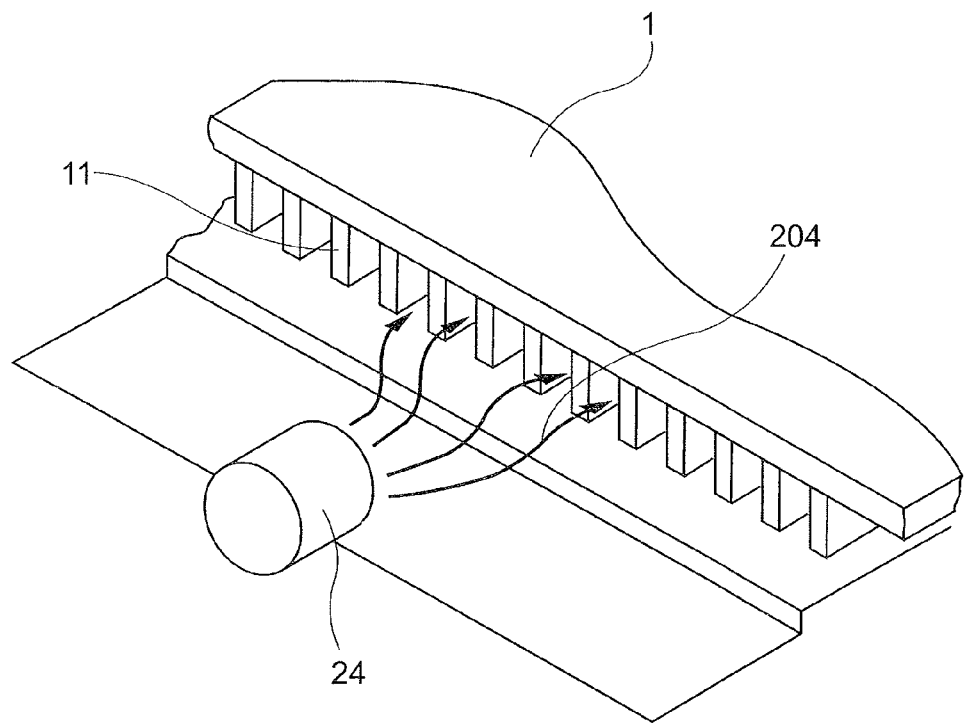
FIG. 6 is a conceptual diagram illustrating the inflow state of a cooling medium flowing into the fins in the related art.

The cooling medium flows uniformly with respect to the blade fins 11 arranged in a direction perpendicular to the flow direction of the cooling medium by the synergistic interaction between the cooling medium diffusion room 26 and the cooling medium diffusion wall 25. When the cooling medium diffusion wall 25 is not provided, as illustrated in FIG. 6, a large amount of cooling medium discharged from the cooling medium introduction port 24 flows to the central blade fins 11 which are arranged immediately before the cooling medium introduction port 24, particularly, the lower parts of the blade fins 11, as represented by an arrow 204, and a small amount of cooling medium flows to the blade fins 11 which are far away from the cooling medium introduction port 24. In addition, a small amount of cooling medium flows to the upper parts of the blade fins 11, that is, parts in the vicinity of the heat sink 1. As a result, cooling efficiency is reduced. Furthermore, cooling efficiency by the blade fins 11 which are far away from the cooling medium introduction port 24 is lower than that by the blade fins 11 arranged in the vicinity of the cooling medium introduction port 24. As a result, the semiconductor circuits 14 to 16 are not sufficiently cooled, which results in a large variation in cooling efficiency among a plurality of semiconductor circuits 14 to 16 attached to the heat sink 1.

Figure 7:
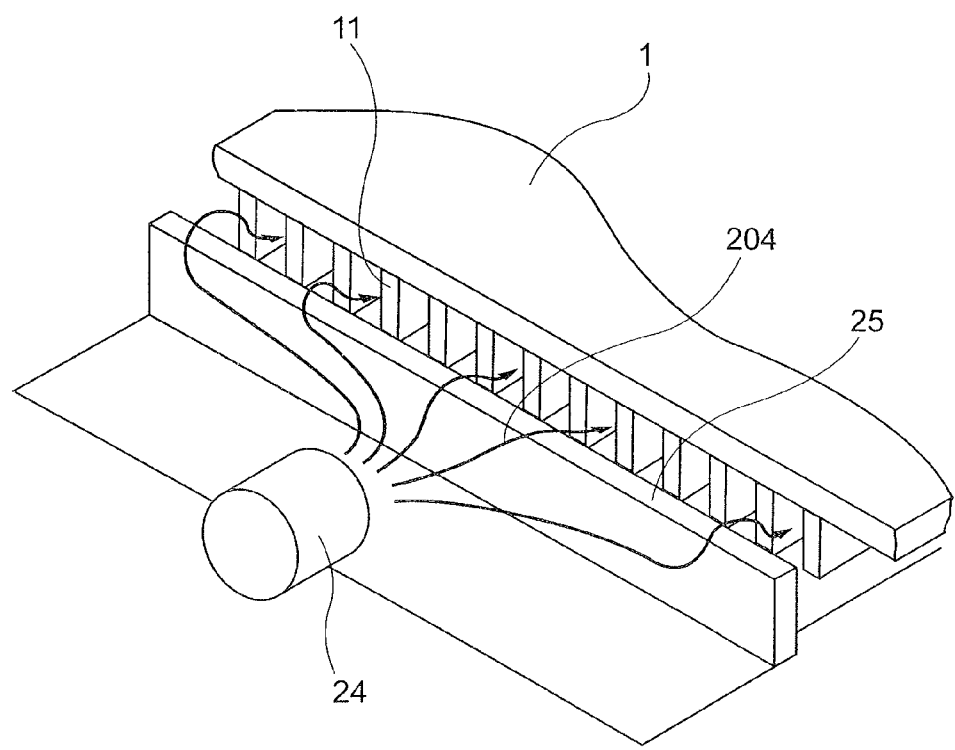
FIG. 7 is a conceptual diagram illustrating the inflow state of a cooling medium flowing into the fins in the invention.

When the cooling medium diffusion wall 25 is provided, as represented by an arrow 204 in FIG. 7, the cooling medium flowing from the cooling medium introduction port 24 is blocked by the cooling medium diffusion wall 25, is widely diffused in the cooling medium diffusion room 26 on the left and right sides in the width direction, and flows to the upper parts of the blade fins 11, that is, gaps between the blade fins 11 close to the heat sink 1 over the cooling medium diffusion wall 25. When the flow path is formed, the cooling medium flows uniformly in the center and periphery of the inlet in the width direction.

As illustrated in FIG. 4, the height H of the cooling medium diffusion wall 25 may be equal to or more than that of the upper end of the cooling medium introduction port 24 (H≥0). The cooling medium diffusion room 26 may have a rectangular shape in a horizontal cross-sectional view. However, as illustrated in FIG. 5, when the cooling medium diffusion room 26 is formed so as to be widened from the cooling medium introduction port 24 to the cooling medium diffusion wall 25, it is possible to effectively diffuse the cooling medium flowing from the cooling medium introduction port 24 in the left-right direction perpendicular to the flow direction. That is, when the cooling medium diffusion room 26 illustrated in FIG. 5 is formed such that the tilt angle θin of the side wall forming the cooling medium diffusion room 26 with respect to the flow direction of the cooling medium is equal to or less than 90°, the cooling medium flows uniformly. Specifically, the cooling medium is smoothly diffused in the range of 60°≤θin≤80°, which distributes to improving the cooling performance.

Figure 8A:
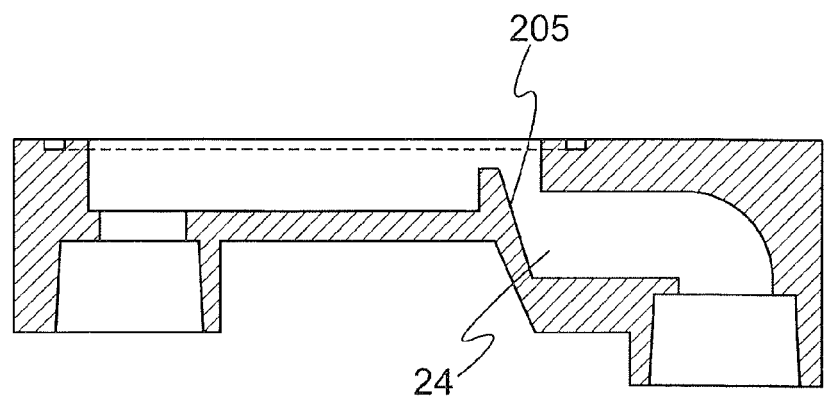
FIG. 8(a) is a diagram illustrating a second embodiment of a cooling medium diffusion wall according to the invention and FIG. 8(b) is a cross-sectional view taken along the line C-C' of FIG. 5.
Figure 8B:
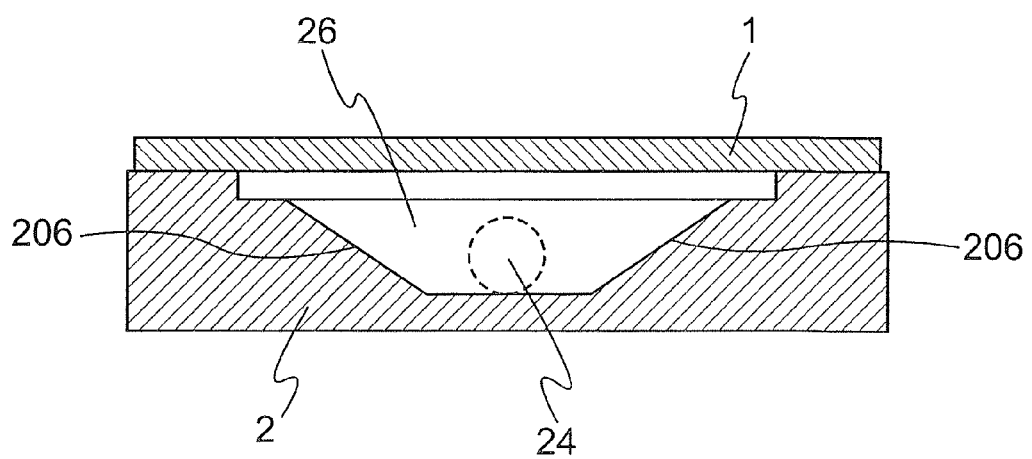

For the vertical cross-sectional structure of the cooling medium diffusion room 26, as illustrated in FIG. 8(b), a tapered inclined plane 206 is formed in the bottom. In this case, the cooling medium can flow smoothly, which contributes to making the cooling medium flow uniformly and making the temperature of a semiconductor chip uniform. That is, when the cooling medium diffusion room 26 is formed to have an inverted trapezoidal shape in a cross-sectional view as illustrated in FIG. 8(b), the cooling medium can flow smoothly, which contributes to making the cooling medium flow uniformly and making the temperature of the semiconductor chip uniform.

A surface of the cooling medium diffusion wall 25 facing the cooling medium diffusion room 26, that is, a surface of the cooling medium diffusion wall 25 facing the cooling medium introduction port 24 may be a vertical surface as illustrated in FIG. 4. However, the surface of the cooling medium diffusion wall 25 may be an inclined plane which is inclined forward from the lower part to the upper part thereof, like an inclined plane 205 of the cooling medium diffusion wall 25 illustrated in FIG. 8(a). In this case, the cooling medium can flow uniformly, which contributes to making the temperature of the semiconductor chip uniform. The tilt angle with respect to verticality may be in the range of 60 degrees to 80 degrees.

For the cooling medium convergence room 27, similarly to the cooling medium diffusion room 26, the cooling medium convergence room 27 may have a rectangular shape in a horizontal cross-sectional view. However, as illustrated in FIG. 5, when the cooling medium convergence room 27 is formed so as to be widened from the cooling medium discharge port 21 to the end of the blade fin 11 in the flow direction of the cooling medium, the cooling medium can flow smoothly, which contributes to making the cooling medium flow uniformly and making the temperature of the semiconductor chip uniform. Specifically, the tilt angle θout of the side wall forming the cooling medium convergence room 27 with respect to the flow direction of the cooling medium is set in the range of 60°≤θout≤80°. In this case, the cooling medium flows uniformly, which contributes to improving the cooling performance.

For the dimensions of a cooler manufactured as an example, in FIG. 4, the cooling medium introduction port 24 has Din=13 mm and D=13 mm. For the relation between the height of the cooling medium diffusion wall 25 and the upper end of the cooling medium introduction port 24, H is 4.5 mm. The difference SS between the center position of the cooling medium introduction port 24 in the vertical direction and the bottom of the cooling fin cooling room 28 is 3 mm. A gap S between the lower end of the blade fin 11 and the bottom of the cooling fin cooling room 28 is 0.5 mm. The diameter Dout of the cooling medium discharge port 21 is 13 mm. The height Hf of the blade fin is 10 mm.

In the invention, the cooling medium flows uniformly in a direction perpendicular to the flow direction of the cooling medium. It is preferable that the semiconductor circuits 14 to 16 to be cooled be arranged on the heat sink 1 in a direction intersecting the flow path of the cooling medium, particularly, in a direction perpendicular to the flow path of the cooling medium in order to equally improve the cooling effects of the semiconductor circuits 14 to 16, as illustrated in FIG. 1.

An O-ring 23 serving as a sealing member may be provided outside and along the opening 30 between the heat sink 1 and the cooling medium jacket 2 so as to surround the flow path of the cooling medium in the cooling medium jacket 2. In this case, the sealing member is not limited to the O-ring 23, but other sealing members, such as packing, may be used.

Figure 9:
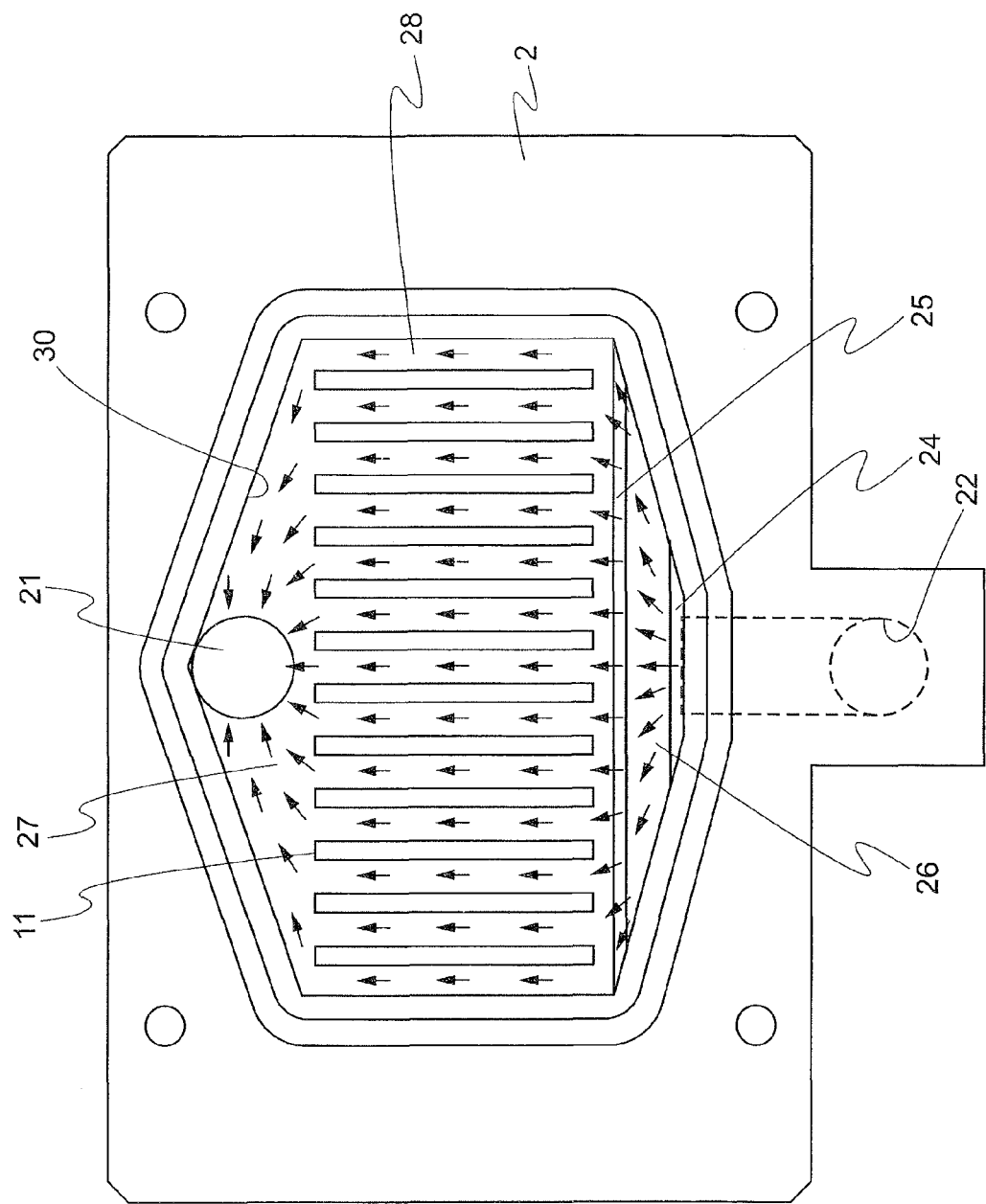
FIG. 9 is a conceptual diagram illustrating the simulation result of the flow of the cooling medium according to the invention using blade fins.

FIG. 9 illustrates the simulation result of the flow of the cooling medium for the structure using the blade fins 11. The cooling medium flows uniformly in both the central blade fins 11 and the peripheral blade fins 11. The simulation result of the temperature distribution of the semiconductor element for this structure proved that a low temperature and a uniform temperature distribution were obtained from each IGBT element 13 of the semiconductor circuits 14 to 16. The heat sink 1 and the cooling medium jacket 2 are made of a metal material with high thermal conductivity, such as cooper or aluminum.

Figure 11:
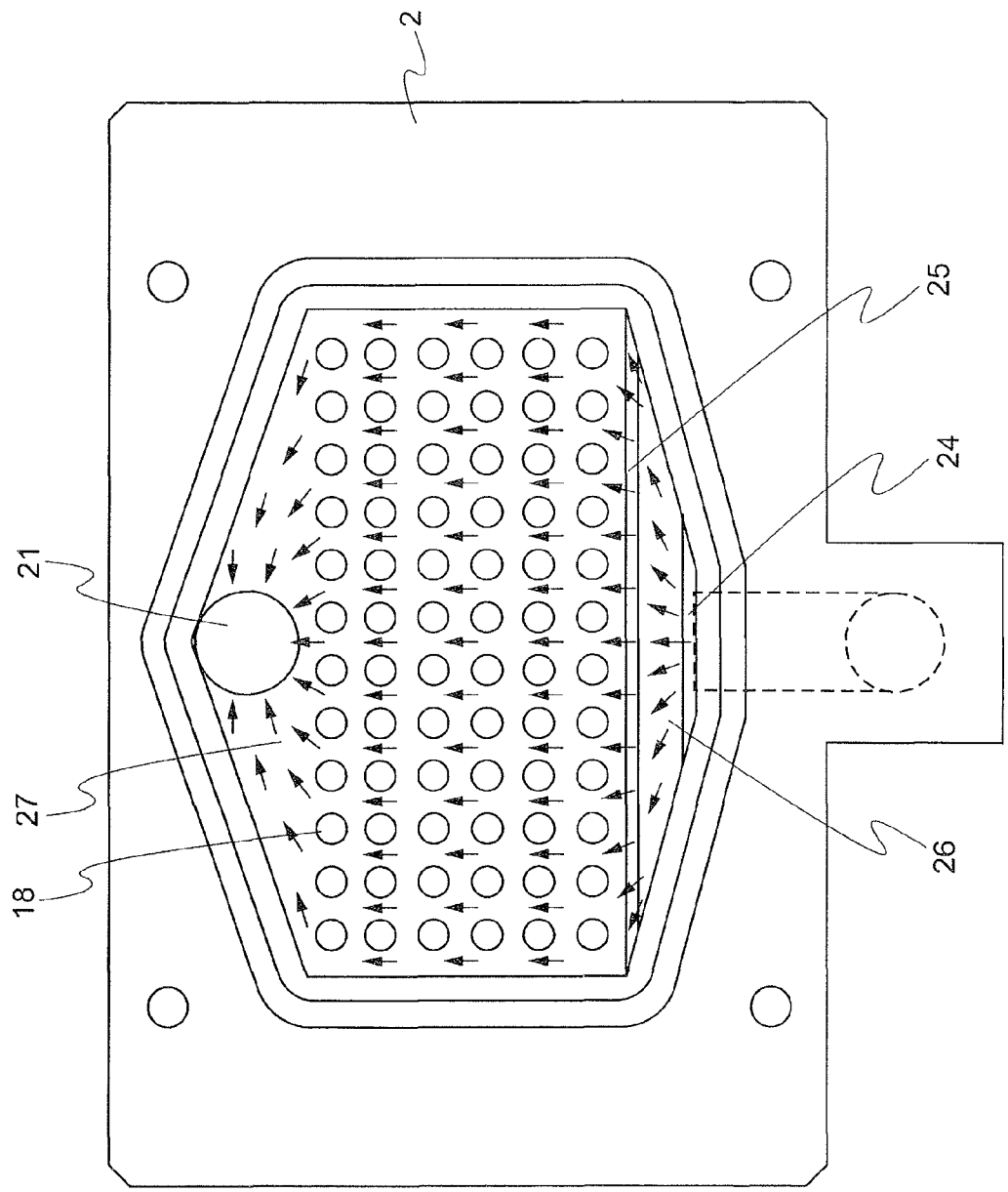
FIG. 11 is a conceptual diagram illustrating the simulation result of the flow of the cooling medium according to the invention using the circular pins arranged in parallel.
Figure 15:
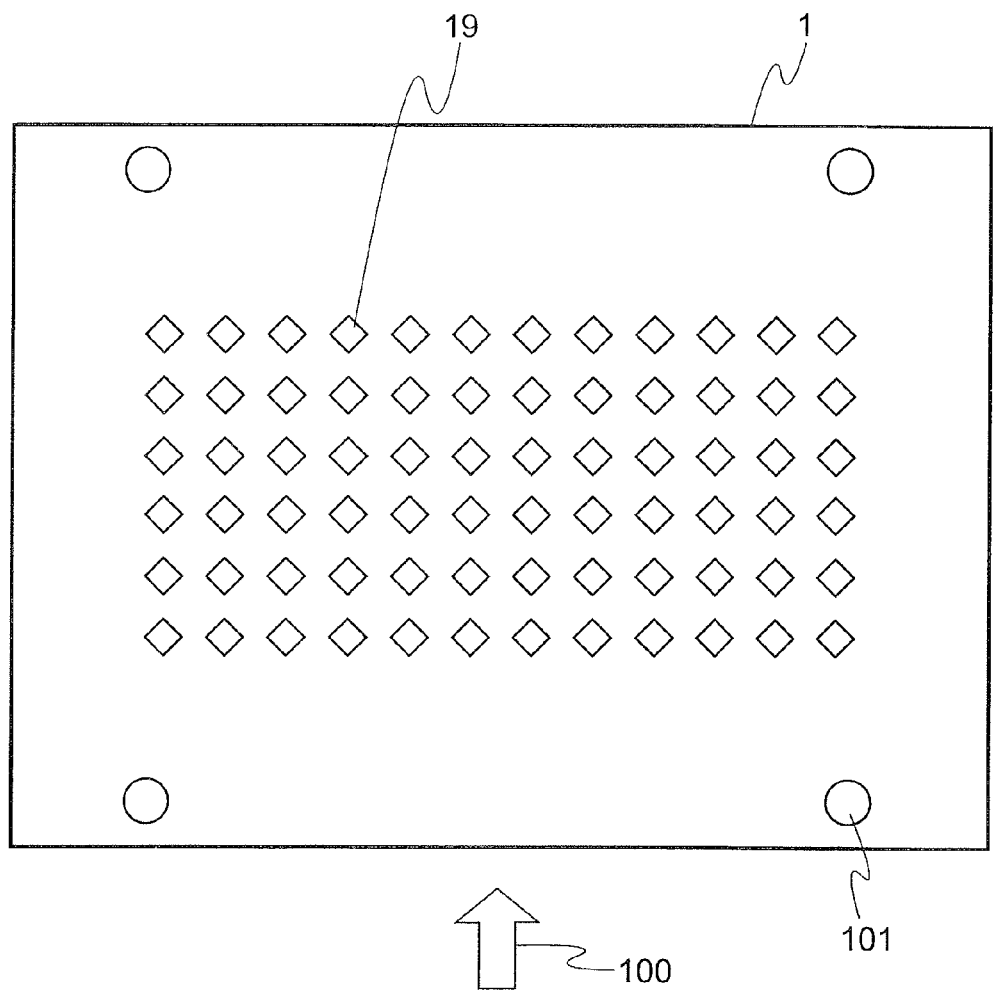
FIG. 15 is a diagram illustrating an example of a fin structure according to the invention in which angular pins are arranged in parallel.

In the above-described embodiment, the blade fin 11 is used as a fin provided in the heat sink 1. However, circular pins 18 having a circular shape in a cross-sectional view may be arranged in parallel, as illustrated in FIG. 11, and angular pins 19 having a rectangular shape in a cross-sectional view may be arranged in parallel, as illustrated in FIG. 15. In this case, the same operation and effect as described above are obtained.

Figure 12:
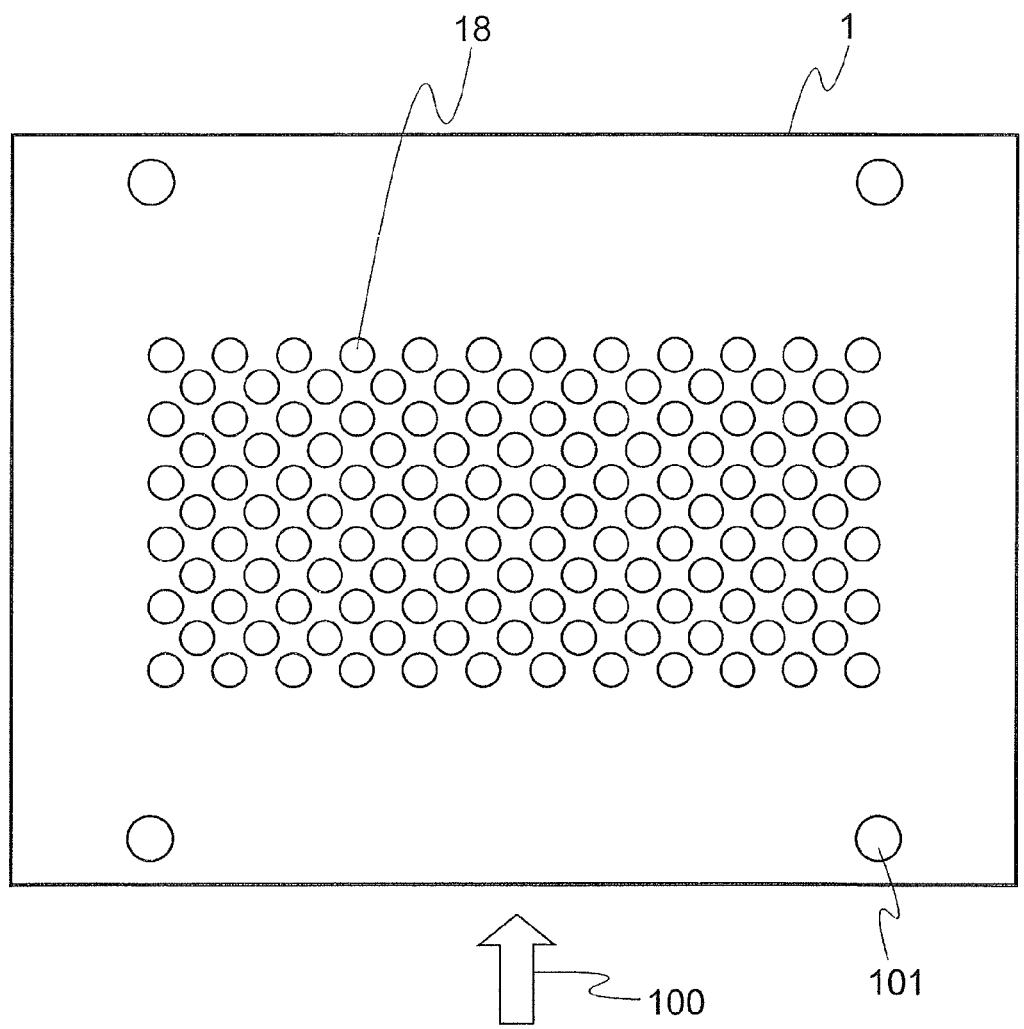
FIG. 12 is a diagram illustrating an example of a fin structure according to the invention in which circular pins are arranged in a zigzag.
Figure 13:
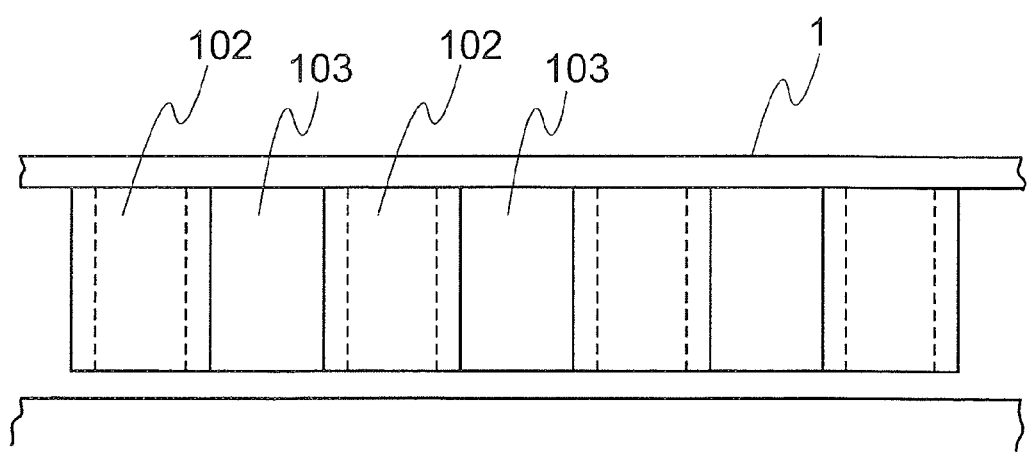
FIG. 13 is a diagram illustrating an example of the fins illustrated in FIG. 12.
Figure 16:
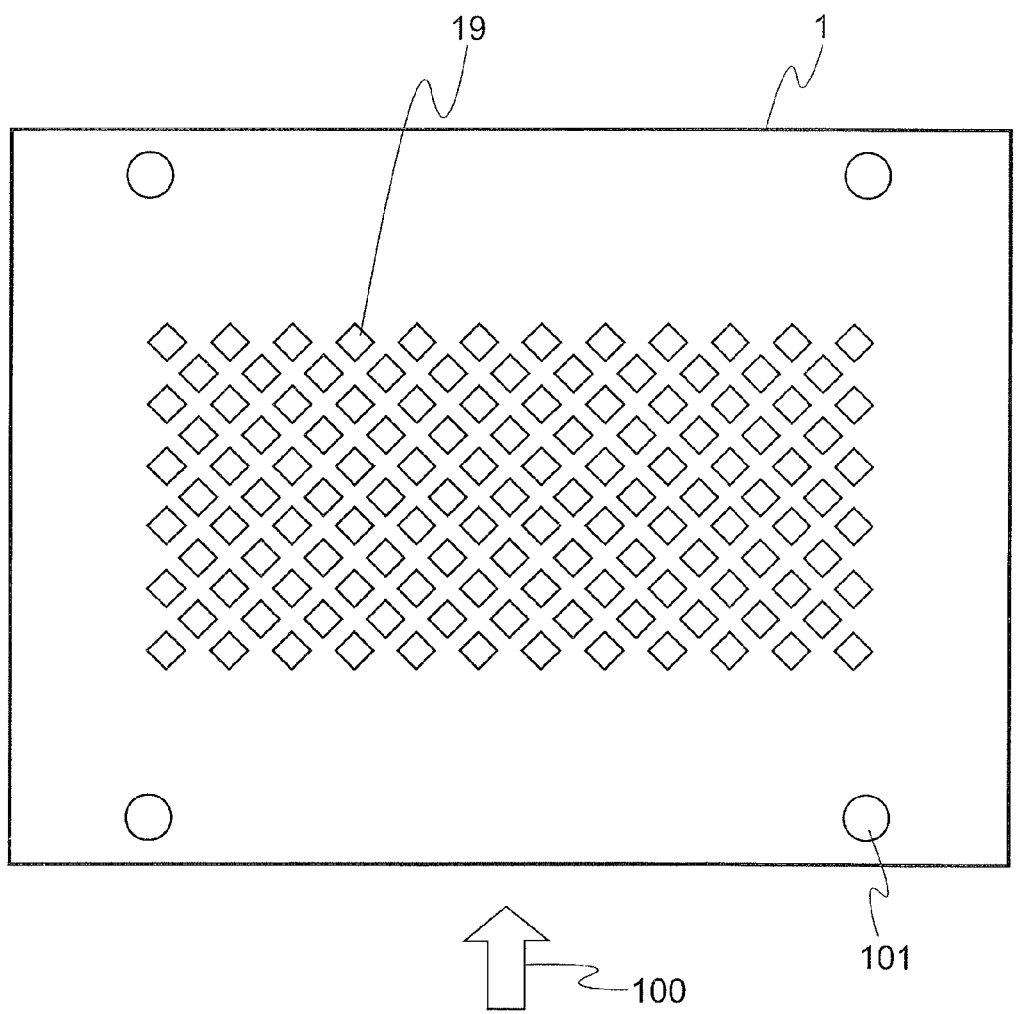
FIG. 16 is a diagram illustrating an example of a fin structure according to the invention in which the angular pins are arranged in a zigzag.

FIG. 12 illustrates a fin structure in which the circular pins 18 are arranged in a zigzag. In FIG. 12, FIG. 15, and FIG. 16, an arrow 100 indicates the flow direction of the cooling medium and reference numeral 101 indicates an attachment hole. FIG. 16 illustrates a fin structure in which the angular pins 19 are arranged in a zigzag. When the fins illustrated in the drawings are used, the same effect as described above is obtained in the invention. In this case, for the arrangement density of the circular pins 18, as viewed from the front side (cooling medium introduction side) as illustrated in FIG. 13, cooling efficiency in a case in which the circular pins 18 in a rear row are arranged between the circular pins 18 in a front row without any gap therebetween is higher than that in a case in which the circular pins 18a in the front and rear rows are arranged with a gap therebetween. In FIG. 13, a solid line indicates a pin in the front row and a dotted line indicates a pin in the next row. These fins make it possible to obtain the same effect as described above even through the height of the cooling medium diffusion wall 25 is low, as compared to the blade fins 11.

In the example using the circular pins 18, the diameter of the circular pin 18 is 2 mm, the height of the circular pin 18 is 10 mm, and the pitch between the circular pins 18 is 1 mm.

In the example using the angular pins 19, the length of one side of the angular pin 19 is 2 mm, the height of the angular pin 19 is 10 mm, and the pitch between the angular pins 19 is 1 mm.

Figure 10:
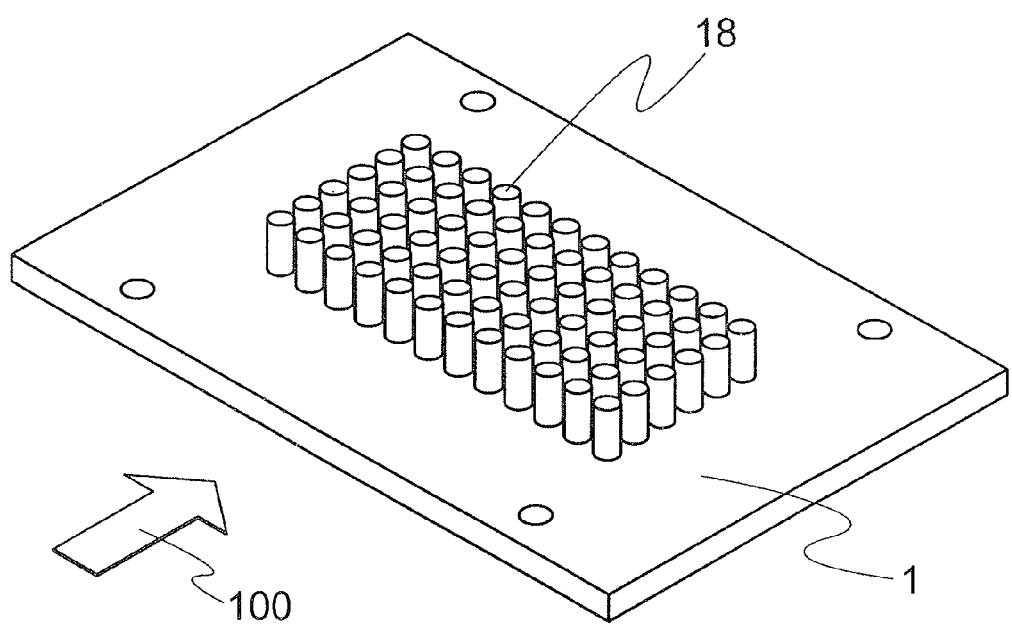
FIG. 10 is a diagram illustrating an example of a fin structure according to the invention in which circular pins are arranged in parallel.
Figure 14:
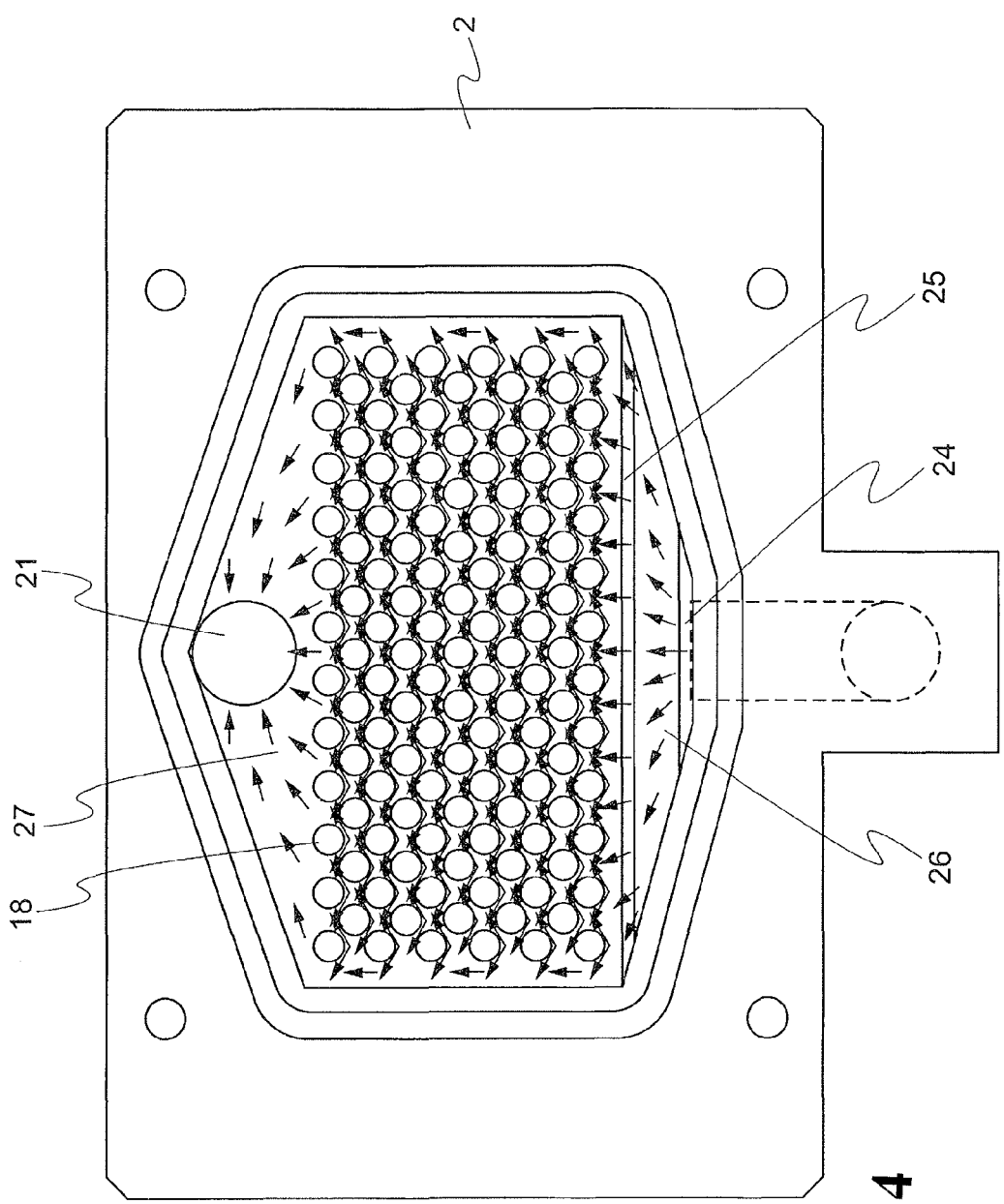
FIG. 14 is a conceptual diagram illustrating the simulation result of the flow of the cooling medium according to the invention using the circular pins arranged in a zigzag.

FIG. 11 is a conceptual diagram illustrating the simulation result of the flow of the cooling medium in the fin structure illustrated in FIG. 10 in which the circular pins 18 are arranged in parallel. FIG. 14 is a conceptual diagram illustrating the simulation result of the flow of the cooling medium in the invention in which the circular pins 18 are arranged in a zigzag. The simulation result provided that the cooling medium flows uniformly in both the central fins and the peripheral fins. For these structures, the temperature distribution of the semiconductor chip was simulated and measured. The simulation result proved that a low temperature and a uniform temperature distribution were obtained from each IGBT element 13 of the semiconductor circuits 14 to 16, as illustrated in Table 1.

Figure 17:
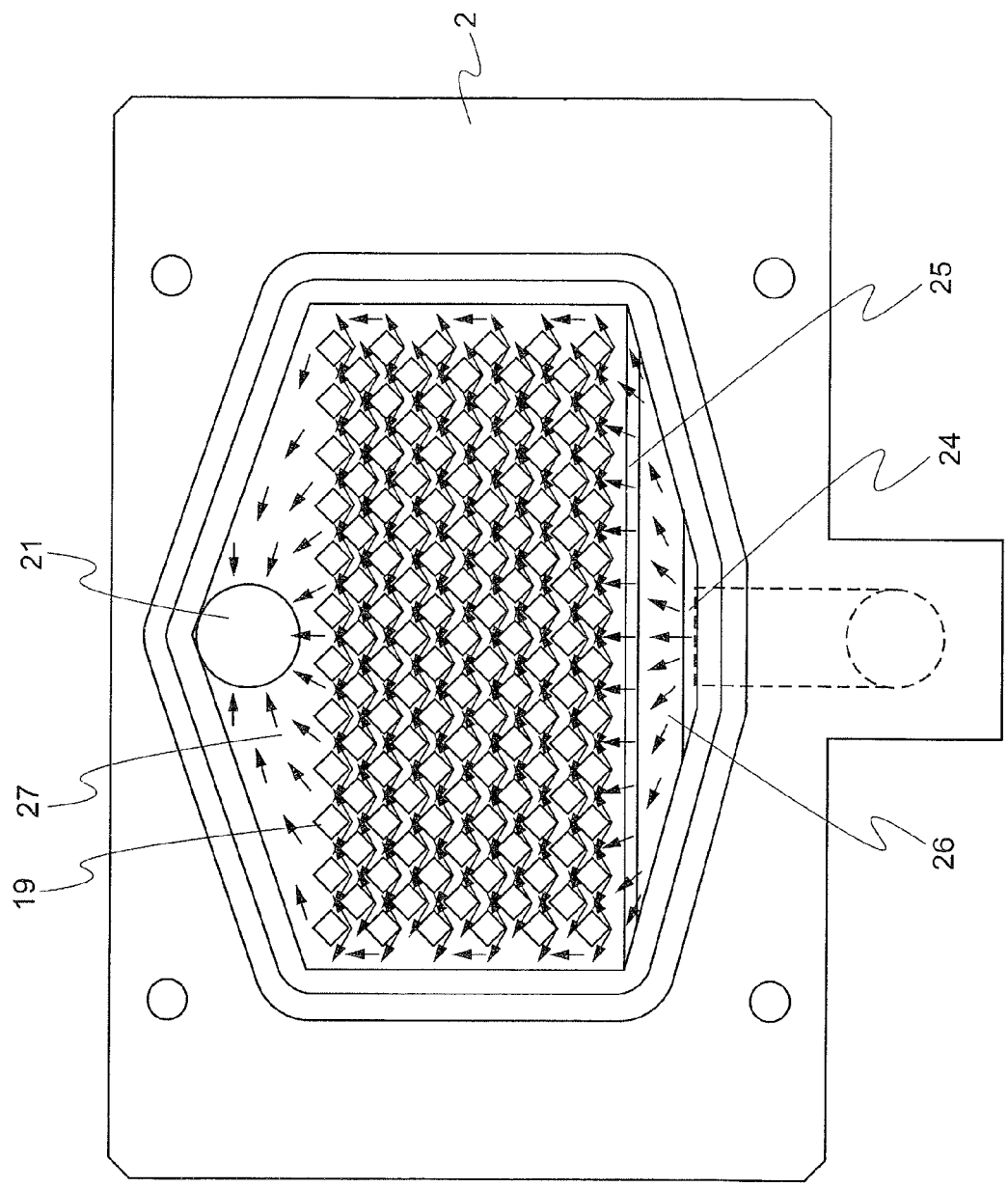
FIG. 17 is a conceptual diagram illustrating the simulation result of the flow of the cooling medium according to the invention using the angular pins arranged in a zigzag.

Similarly, the same effect is obtained from the angular pins 19 illustrated in FIG. 17 which are arranged in a zigzag. In this case, similarly to the arrangement of the circular pins 18, cooling efficiency in a case in which there is no gap between the angular pins 19 is more than that in a case in which there is a gap between the angular pins 19. In addition, this structure is similar to the blade fins 11 in that the same effect as described above is obtained even though the height of the cooling medium diffusion wall 25 is low.

Figure 21:
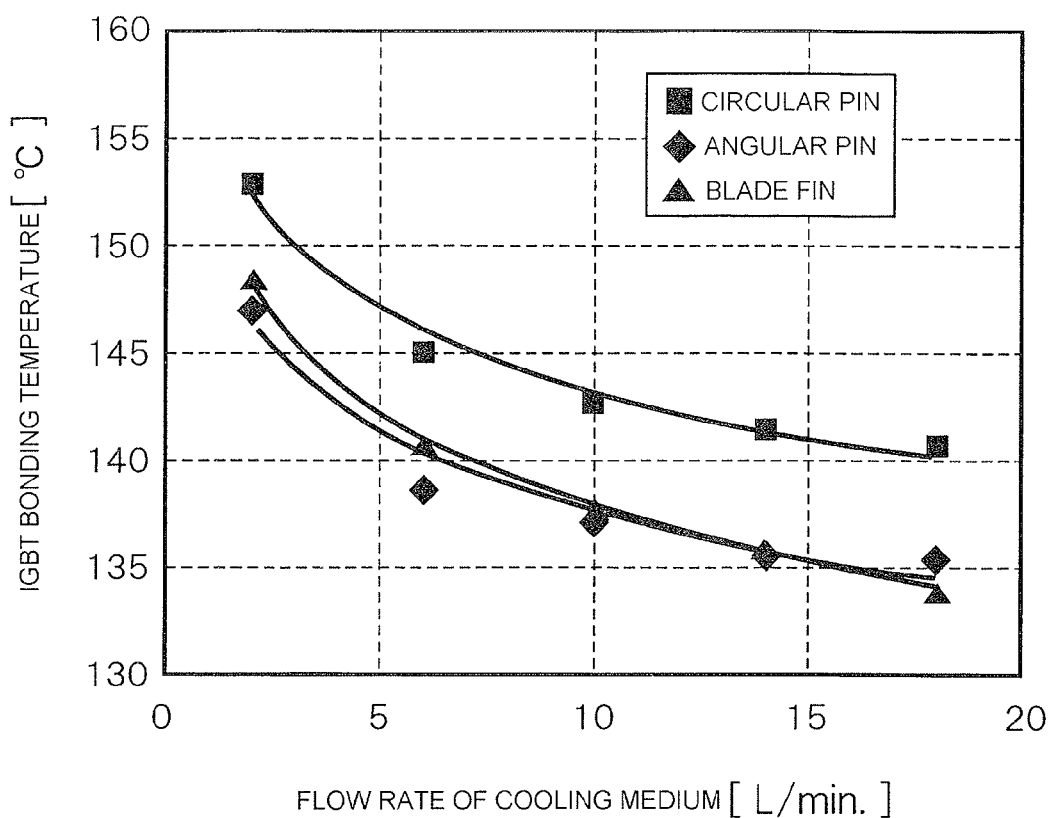
FIG. 21 is a graph illustrating the relation between the flow rate of the cooling medium and an IGBT bonding temperature when the circular pins, the angular pins, and the blade fins are used.
Figure 22:
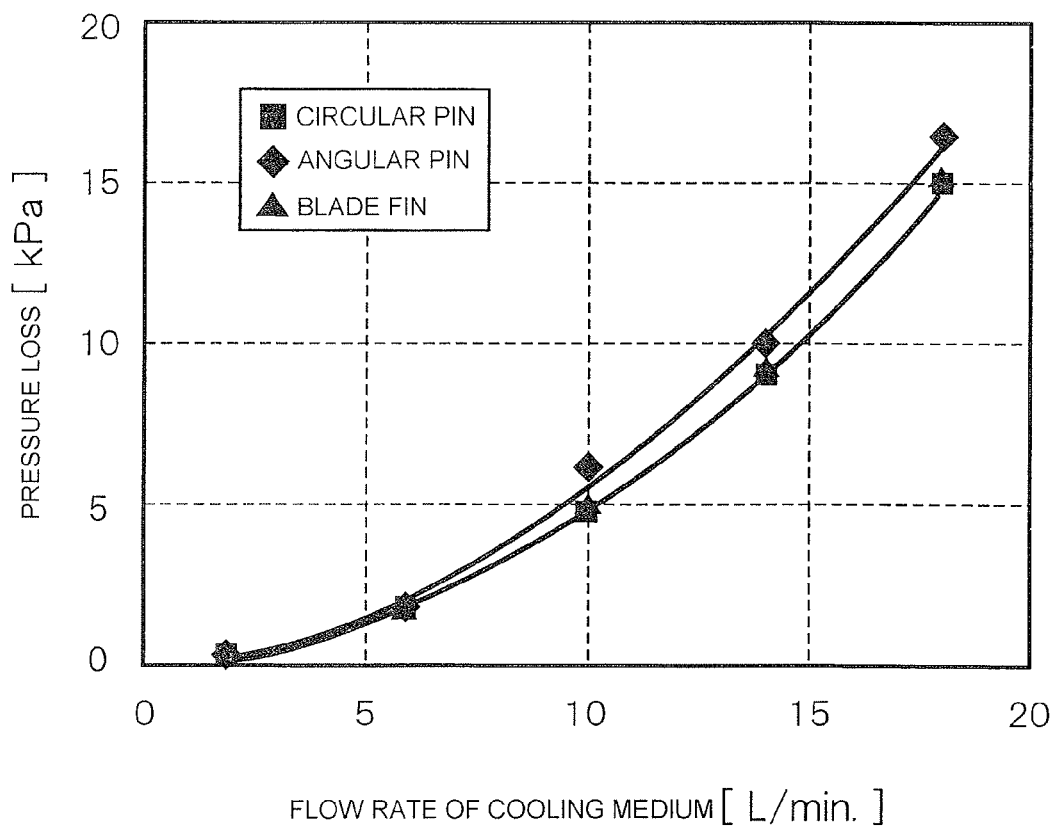
FIG. 22 is a graph illustrating the relation between the flow rate of the cooling medium and pressure loss when the circular pins, the angular pins, and the blade fins are used.

For the cooling fins, that is, the blade fins 11, the circular pins 18, and the angular pins 19, an IGBT bonding temperature with respect to the flow rate of the cooling medium and pressure loss with respect to the flow rate are measured in an example in which the IGBT chip is provided in the semiconductor circuit. FIGS. 21 and 22 illustrate the measurement results. The maximum chip temperature was 141.6° C. in the case of the circular pin fin and was 136.0° C. in the case of the angular pin fin. The pressure loss was 4.8 kPa in the case of the circular pin fin and was 6.0 kPa in the case of the angular pin fin. The pressure loss of the circular pin fin is small since the volume density of the fin is low. On the contrary, the chip temperature of the angular pin fin is low since the surface area thereof is large, but the pressure loss of the angular pin fin is large since the volume density thereof is high. The measurement results proved that the cooling performance was improved in the order of the circular pin 18, the angular pin 19, and the blade fin 11.

In order to check the validity of the cooling performance predicted by the simulation, the actual device was used to check an increase in the chip temperature for the angular pin 19. The measurement conditions were as follows so as to be matched with the simulation conditions:

Generation loss: IGBT: 258 W and FWD: 31 W;
Cooling medium: LLC 50%;
Flow rate: 5 to 15L/min; and
Temperature of cooling medium: 65° C.

Figure 23:
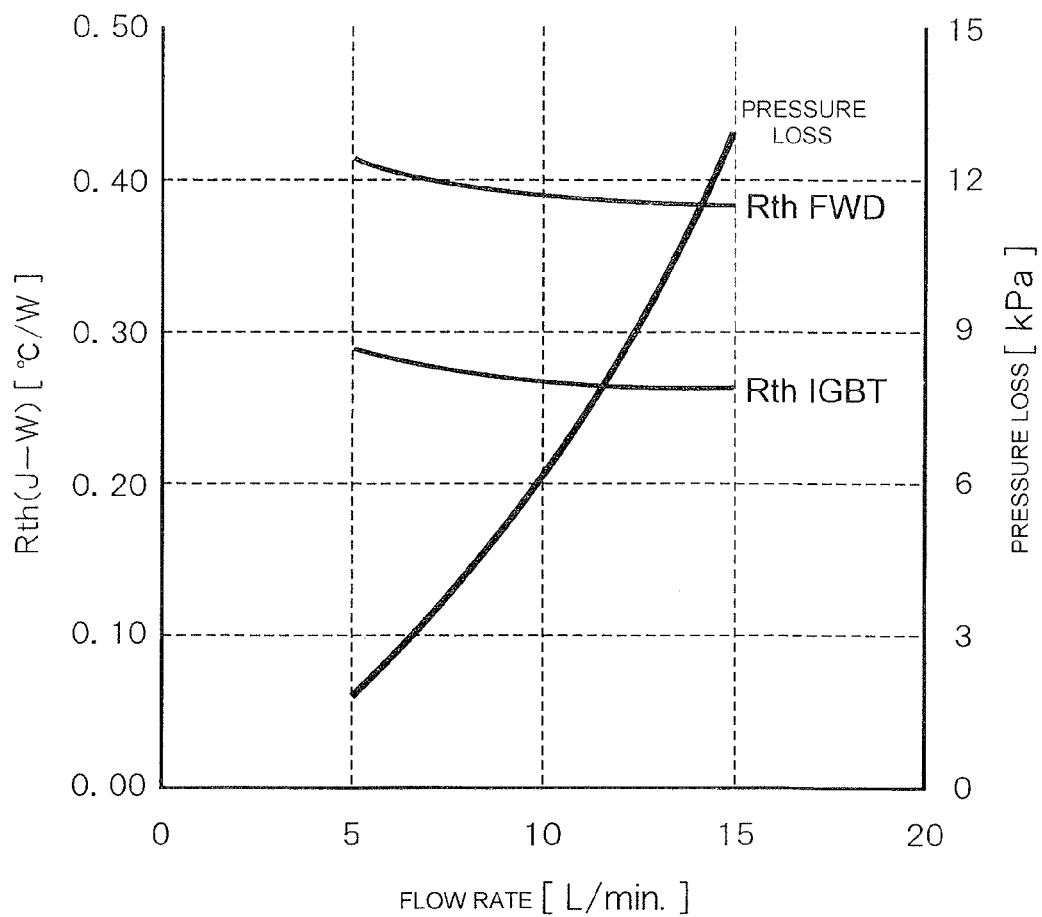
FIG. 23 is a graph illustrating the dependency of thermal resistance and pressure loss on the flow rate.
Figure 24:
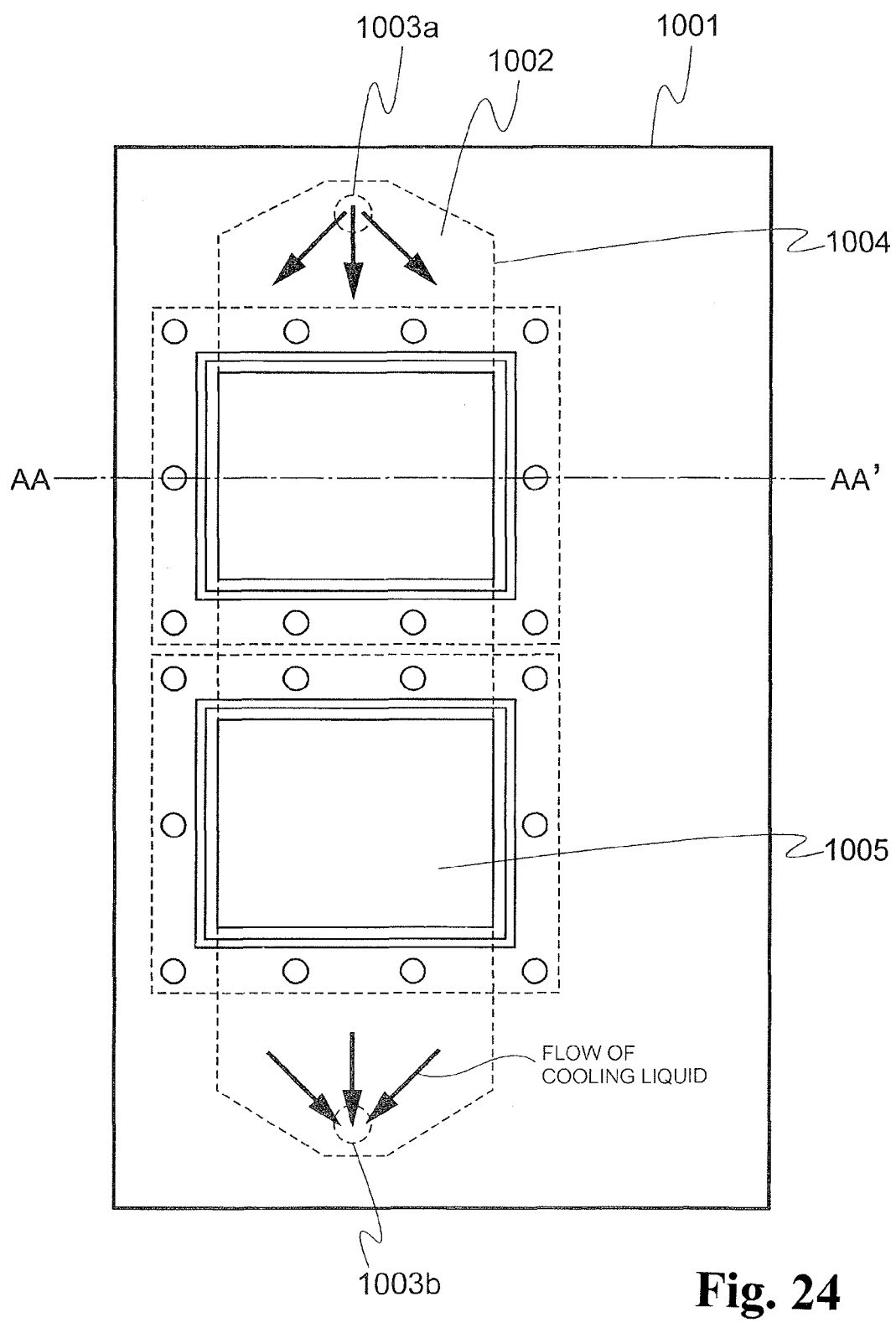
FIG. 24 is a diagram illustrating the related art.
Figure 25:
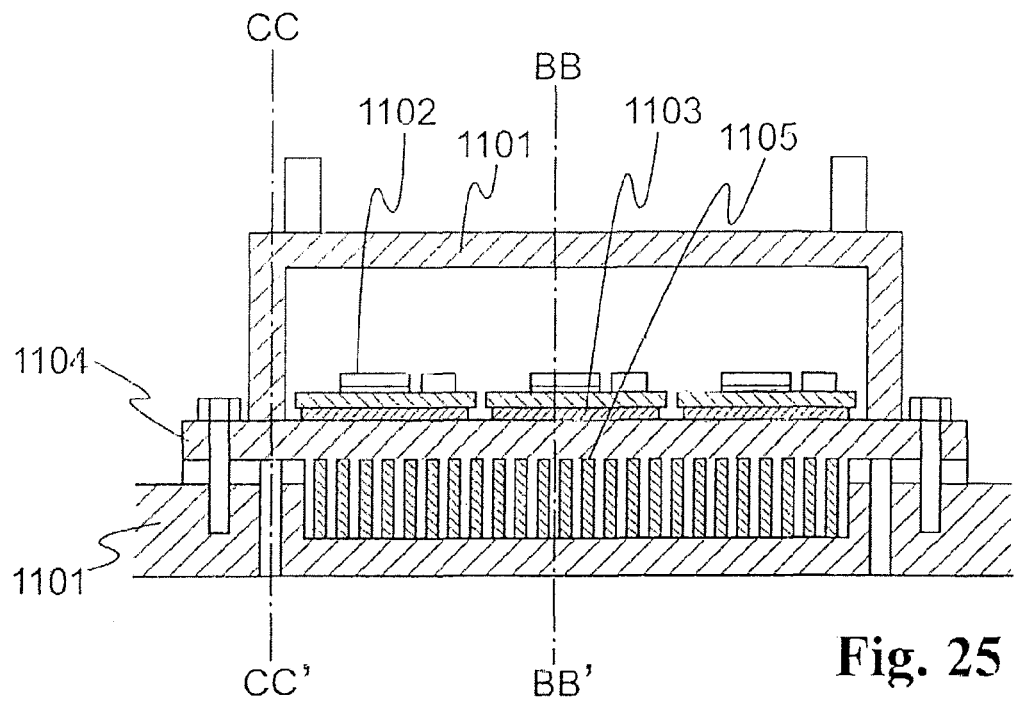
FIG. 25 is a cross-sectional view taken along the line AA-AA' of FIG. 24.
Figure 26:
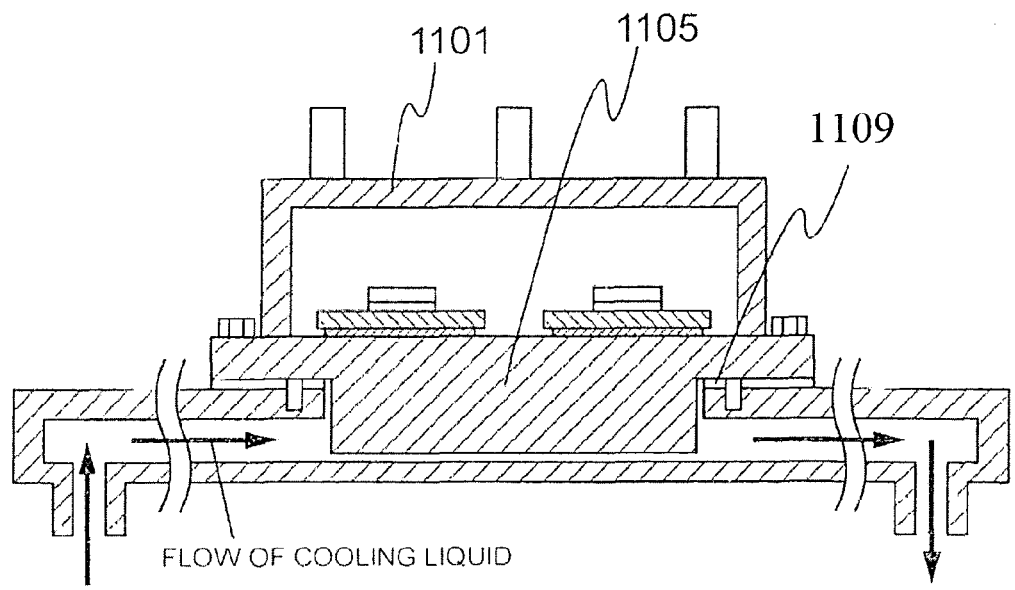
FIG. 26 is a cross-sectional view taken along the line BB-BB' of FIG. 24.

Comparison with the simulation for the angular pin 19 was performed at a flow rate of 10 L/min. The comparison results are listed in Table 1. In Table 1, A to F correspond to the IGBT elements 13 which are arranged from the upper left side to the lower right side in FIG. 1(a). It was confirmed that the maximum error of each phase was about 2% and the simulation value and the measured value were substantially equal to each other. Thermal resistance was calculated from the measurement result and was 0.27 K/W (IGBT average value). Measurement was performed while changing the flow rate and the measurement result proved that the thermal resistance depended on the flow rate. FIG. 23 is a graph (measured value) illustrating the dependency of thermal resistance and pressure loss on a flow rate of 5 L/min to 15 L/min. As can be seen from the comparison between 5 L/min and 15 L/min, the thermal resistance of both the IGBT and the FWD at a flow rate of 15 L/min is about 10% lower than that at a flow rate of 5 L/min. It is understood that, when the flow rate increases, the radiation performance is improved.

[Table 1]

TABLE 1

Simulation value and measured value of chip temperature

| Example | A | B | C | D | E | F |
|---|---|---|---|---|---|---|
| Measured value (° C.) | 133.6 | 137.6 | 138.4 | 139.1 | 136.6 | 137.7 |
| Simulation value | 136.7 | 137.4 | 137.1 | 137.6 | 136.9 | 136.9 |
| Error (%) | 2.3 | 0.1 | 0.9 | 1.1 | 0.2 | 0.6 |

Figure 18:
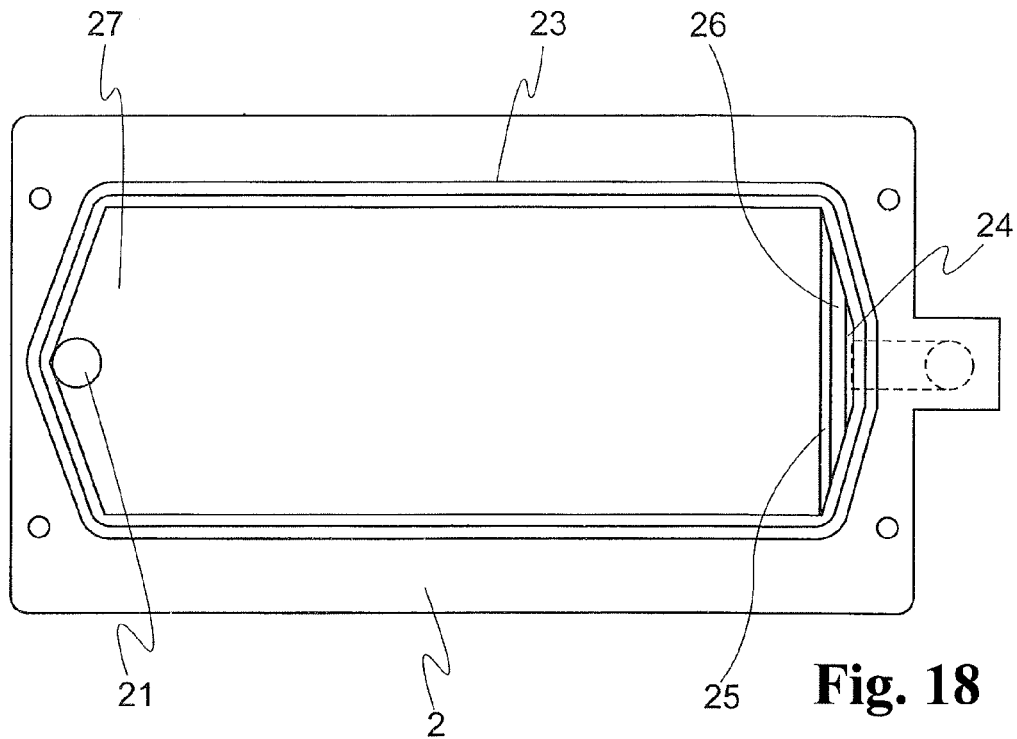
FIG. 18 is a conceptual diagram illustrating an embodiment of the invention in which the cooling medium flows in the longitudinal direction of the cooling medium jacket.

In the above-described embodiment, the flow path of the cooling medium is formed in the lateral direction of the cooling medium jacket 2. However, as illustrated in FIG. 18, the cooling medium inlet 22, the cooling medium diffusion room 26, the cooling medium diffusion wall 25, the cooling fin cooling room 28, the cooling medium convergence room 27, and the cooling medium discharge port 21 may be formed in the longitudinal direction of the cooling medium jacket 2 and the flow path of the cooling medium may be formed in the longitudinal direction. In this case, the same effect as that when the flow path of the cooling medium is formed in the lateral direction is obtained.

When the semiconductor module, such as an IBGT module, is used for a vehicle, the smoothing condenser 4 is used. In general, the smoothing condenser 4 is arranged on the side surface of the IGBT module in the longitudinal direction, as illustrated in FIG. 2. Therefore, there are restrictions in the introduction and discharge directions of the cooling medium to and from the semiconductor module cooler 3, in the attachment of the cooling medium inlet and the cooling medium outlet.

Figure 19A:
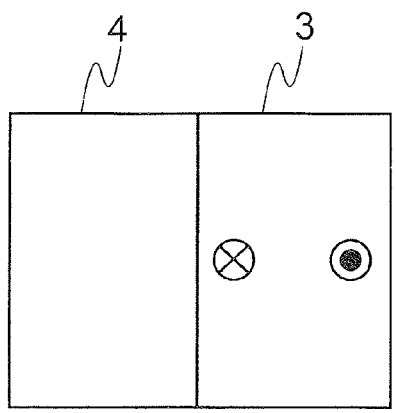
FIG. 19(a), 19(b) are conceptual diagrams illustrating an example of the inflow and outflow positions of the cooling medium in an embodiment of the invention in which the cooling medium flows in the lateral direction of the cooling medium jacket.
Figure 19B:
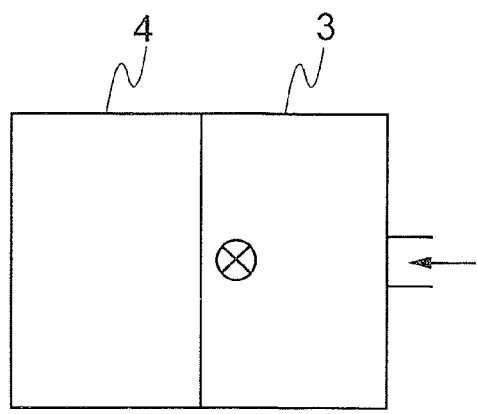
Figure 20A:
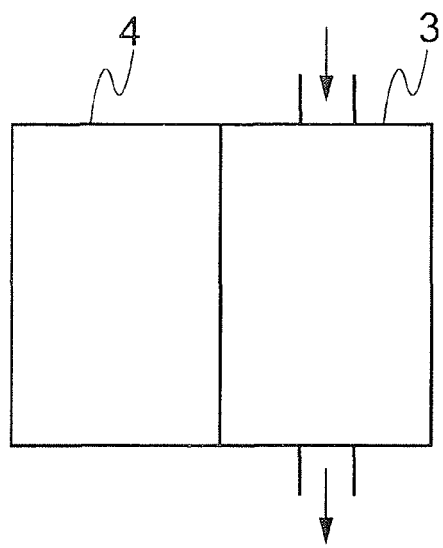
FIGS. 20(a)-20(d) are conceptual diagrams illustrating an example of the inflow and outflow positions of the cooling medium in an embodiment of the invention in which the cooling medium flows in the longitudinal direction of the cooling medium jacket.
Figure 20B:
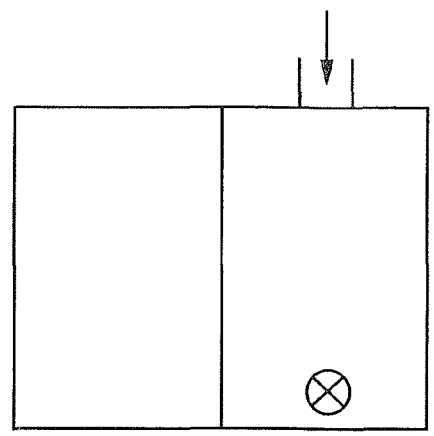
Figure 20C:
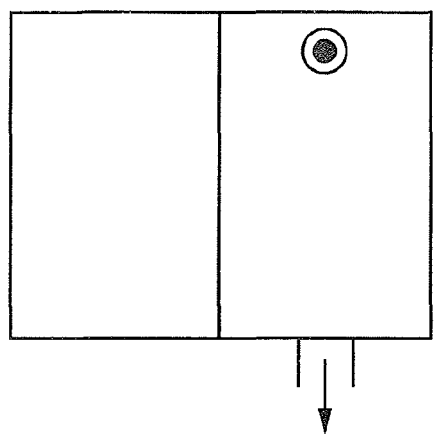
Figure 20D:
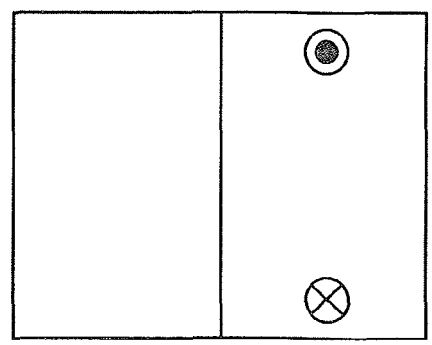

FIGS. 19(a), 19(b) illustrate the arrangement of the cooling medium inlet and the cooling medium outlet when the flow path of the cooling medium is formed in the lateral direction. That is, the arrangement of the cooling medium inlet and the cooling medium outlet illustrated in FIG. 19(a) is reverse to that illustrated in FIG. 2 in the left-right direction. In this case, the smoothing condenser 4 is arranged on the side of the cooling medium outlet. The structure illustrated in FIG. 19(b) differs from the structure illustrated in FIG. 19(a) in that the cooling medium inlet is formed in the right side surface of the cooling medium jacket 2. In this case, the smoothing condenser 4 is arranged on the side of the cooling medium outlet.

FIGS. 20(a)-20(d) illustrate the arrangement of the cooling medium inlet and the cooling medium outlet when the flow path of the cooling medium is formed in the longitudinal direction of the cooling medium jacket 2. That is, in the structure illustrated in FIG. 20(a), the cooling medium inlet is arranged at one end of the cooling medium jacket 2 in the longitudinal direction, the cooling medium outlet is arranged at the other end, and the smoothing condenser 4 is arranged at the left end of the cooling medium jacket 2 in the lateral direction. The structure illustrated in FIG. 20(b) differs from the structure illustrated in FIG. 20(a) in that the cooling medium outlet is arranged in the lower surface. The structure illustrated in FIG. 20(c) differs from the structure illustrated in FIG. 20(a) in that the cooling medium inlet is arranged in the lower surface. The structure illustrated in FIG. 20(d) differs from the structure illustrated in FIG. 20(a) in that both the cooling medium inlet and the cooling medium outlet are arranged in the lower surface.

The invention can be applied to any of the arrangements of the cooling medium inlet and the cooling medium outlet. In this case, the same effect as that in the above-described embodiment is obtained. In the drawings, a double circle indicates that the cooling medium flows from the lower side to the upper side of the plane of paper. A circle having an x mark therein indicates that the cooling medium flows from the upper side to the lower side of the plane of paper. An arrow indicates the flow direction of the cooling medium.

In the above-described embodiment, three semiconductor circuits 14 to 16 are arranged on the heat sink 1, but the invention is not limited to this. One or more semiconductor circuits may be arranged on the heat sink 1.

In the above-described embodiment, cooling water is used as the cooling medium and the water jacket was used as the cooling medium jacket 2. However, a cooling liquid, such as an antifreezing solution, or cooling gas, such as cooling air, other than the cooling water may be used.

In the above-described embodiment, the angular pin 19 serving as a cooling fin has a rectangular shape in a cross-sectional view, but the invention is not limited to this. An angular pin having a polygonal shape, such as a triangular shape or a hexagonal shape, in a cross-sectional view may be used.

In the above-described embodiment, the upper surfaces of the cooling medium diffusion room 26, the cooling fin cooling room 28, and the cooling medium convergence room 27 in the cooling medium jacket 2 form the opening 30, but the invention is not limited to this. Only the cooling fin cooling room 28 may form the opening.

INDUSTRIAL APPLICABILITY

According to the invention, the cooling medium diffusion wall is provided close to the cooling fins of the cooling medium diffusion room in the cooling medium jacket. Therefore, it is possible to provide a semiconductor module cooler capable of reducing the temperature difference between the semiconductor chips arranged in a direction intersecting the flow direction of a cooling medium with a simple structure.

EXPLANATIONS OF LETTERS OR NUMERALS

1 HEAT SINK
2 COOLING MEDIUM JACKET
3 COOLER
4 SMOOTHING CONDENSER
11 BLADE FIN
12 FREE-WHEEL DIODE
13 IGBT ELEMENT
14 SEMICONDUCTOR CIRCUIT (CIRCUIT FOR W PHASE)
15 SEMICONDUCTOR CIRCUIT (CIRCUIT FOR V PHASE)
16 SEMICONDUCTOR CIRCUIT (CIRCUIT FOR U PHASE)
17, 101 ATTACHMENT HOLE
18, 102, 103 CIRCULAR PIN
19 ANGULAR PIN
21 COOLING MEDIUM DISCHARGE PORT
22 COOLING MEDIUM INLET
23 O-RING
24 COOLING MEDIUM INTRODUCTION PORT
25 COOLING MEDIUM DIFFUSION WALL
26 COOLING MEDIUM DIFFUSION ROOM
27 COOLING MEDIUM CONVERGENCE ROOM
28 COOLING FIN COOLING ROOM
29 CIRCUIT BOARD
100, 201, 202 FLOW DIRECTION OF COOLING MEDIUM
200 SEMICONDUCTOR MODULE
203 CENTER OF COOLING MEDIUM INTRODUCTION PORT
204 FLOW PATH OF COOLING MEDIUM
205 INCLINED PLANE OF COOLING MEDIUM DIFFUSION WALL
206 INCLINED PLANE OF BOTTOM OF COOLING MEDIUM DIFFUSION ROOM

What is claimed is:

1. A semiconductor module cooler comprising:
at least one semiconductor element;
a heat sink supporting the at least one semiconductor element on one surface thereof and including cooling fins formed on another surface opposite to the one side thereof; and
a cooling medium jacket thermally connected to the at least one semiconductor element through the heat sink, wherein the cooling fins are cooled with a cooling medium supplied from an outside to cool the at least one semiconductor element,
the cooling medium jacket including,
a cooling fin cooling room including an opening in which the cooling fins are inserted;
a cooling medium introduction port to introduce the cooling medium;
a cooling medium diffusion room arranged between and communicated with the cooling medium introduction port and the cooling fin cooling room to diffuse the cooling medium introduced from the cooling medium introduction port and to supply the cooling medium to the cooling fin cooling room;
a cooling medium diffusion wall projecting toward the heat sink at one side of the cooling medium diffusion room communicating with the cooling fin cooling room such that the cooling medium diffused in the cooling medium diffusion room flows over the cooling medium diffusion wall to be introduced to the cooling fin cooling room, the cooling medium diffusion wall having an upper end to be positioned higher than bottom portions of the cooling fins to form a space between the upper end and the another surface of the heat sink;
a cooling medium discharge port to discharge the cooling medium to the outside; and
a cooling medium convergence room arranged between and communicated with the cooling fin cooling room and the cooling medium discharge port to converge the cooling medium toward the cooling medium discharge port,
wherein a surface of the cooling medium diffusion wall facing the cooling medium introduction port is an inclined plane which is inclined forward from a lower part to an upper part thereof.

2. The semiconductor module cooler according to claim 1, wherein the cooling medium diffusion room has a shape widening from the cooling medium introduction port toward the cooling medium diffusion wall.

3. The semiconductor module cooler according to claim 1, wherein the cooling fins are arranged in parallel in a width direction perpendicular to a flowing direction of the cooling medium from the cooling medium introduction port to the cooling medium discharge port and continuously extend in the flowing direction of the cooling medium in the cooling fin cooling room, the cooling medium diffusion room has a shape widening in the width direction perpendicular to the flowing direction of the cooling medium from the cooling medium introduction port toward the cooling medium diffusion wall to diffuse the cooling medium uniformly through the cooling medium diffusion wall, and the cooling medium convergence room has a shape narrowing in the width direction perpendicular to the flowing direction of the cooling medium from the cooling fin cooling room toward the cooling medium discharge port to converge the cooling medium smoothly.

4. The semiconductor module cooler according to claim 1, wherein the at least one semiconductor element is arranged on the heat sink in a direction intersecting a flowing direction of the cooling medium from the cooling medium introduction port to the cooling medium discharge port.

5. The semiconductor module cooler according to claim 1, wherein the cooling fins are any one of blade fins formed of a plurality of flat plates, a plurality of circular pins, each having a circular shape in a cross-sectional view, or a plurality of angular pins, each having a polygonal shape in a cross-sectional view.

6. The semiconductor module cooler according to claim 5, wherein when the cooling fins are formed of the plurality of circular pins or the plurality of angular pins, a pin array is arranged in a zigzag array.

7. The semiconductor module cooler according to claim 1, further comprising a sealing member provided between the heat sink and the cooling medium jacket and surrounding at least the opening.

8. The semiconductor module cooler according to claim 1, wherein the cooling medium diffusion wall extends between two side surfaces of the cooling fin cooling room in a width direction perpendicular to a flowing direction of the cooling medium from the cooling medium introduction port to the cooling medium discharge port, and projects vertically from a bottom surface of the cooling medium diffusion room, and the bottom portions of the cooling fins are arranged apart from a bottom surface of the cooling fin cooling room to form a space therebetween.

9. The semiconductor module cooler according to claim 3, wherein the cooling medium diffusion wall is arranged at an upstream in the flowing direction of the cooling medium relative to the cooling fins such that the cooling medium flowing from the cooling medium introduction port is blocked by the cooling medium diffusion wall and diffused in the width direction perpendicular to the flowing direction of the cooling medium to flow to upper parts of the cooling fins.

10. A semiconductor module cooler comprising:
at least one semiconductor element;
a heat sink supporting the at least one semiconductor element on one surface thereof and including cooling fins formed on another surface opposite to the one side thereof; and
a cooling medium jacket thermally connected to the at least one semiconductor element through the heat sink, wherein the cooling fins are cooled with a cooling medium supplied from an outside to cool the at least one semiconductor element,
the cooling medium jacket including,
a cooling fin cooling room including an opening in which the cooling fins are inserted;
a cooling medium introduction port to introduce the cooling medium;
a cooling medium diffusion room arranged between and communicated with the cooling medium introduction port and the cooling fin cooling room to diffuse the cooling medium introduced from the cooling medium introduction port and to supply the cooling medium to the cooling fin cooling room;
a cooling medium diffusion wall projecting toward the heat sink at one side of the cooling medium diffusion room communicating with the cooling fin cooling room such that the cooling medium diffused in the cooling medium diffusion room flows over the cooling medium diffusion wall to be introduced to the cooling fin cooling room, the cooling medium diffusion wall having an upper end to be positioned higher than bottom portions of the cooling fins to form a space between the upper end and the another surface of the heat sink;
a cooling medium discharge port to discharge the cooling medium to the outside; and
a cooling medium convergence room arranged between and communicated with the cooling fin cooling room and the cooling medium discharge port to converge the cooling medium toward the cooling medium discharge port,
wherein a position of the upper end of the cooling medium diffusion wall has a height equal to or greater than that of a position of an upper end of the cooling medium introduction port, and
a surface of the cooling medium diffusion wall facing the cooling medium introduction port is an inclined plane which is inclined forward from a lower part to an upper part thereof.

* * * * *